(12) United States Patent
Kojima et al.

(10) Patent No.: US 9,076,752 B2
(45) Date of Patent: Jul. 7, 2015

(54) SEMICONDUCTOR DEVICE AND METHOD FOR MANUFACTURING THE SAME

(71) Applicant: Panasonic Corporation, Kadoma-shi, Osaka (JP)

(72) Inventors: Toshiyuki Kojima, Kyoto (JP); Tsukasa Shiraishi, Osaka (JP); Norihito Tsukahara, Kyoto (JP); Takayuki Hirose, Osaka (JP); Keiko Ikuta, Osaka (JP); Masayoshi Koyama, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/347,177

(22) PCT Filed: Jan. 10, 2013

(86) PCT No.: PCT/JP2013/000036
§ 371 (c)(1),
(2) Date: Mar. 25, 2014

(87) PCT Pub. No.: WO2013/121691
PCT Pub. Date: Aug. 22, 2013

(65) Prior Publication Data
US 2014/0231981 A1 Aug. 21, 2014

(30) Foreign Application Priority Data
Feb. 14, 2012 (JP) ................. 2012-029005

(51) Int. Cl.
*H01L 23/48* (2006.01)
*H01L 23/34* (2006.01)
(Continued)

(52) U.S. Cl.
CPC ............ *H01L 23/36* (2013.01); *H01L 23/4006* (2013.01); *H01L 23/492* (2013.01);
(Continued)

(58) Field of Classification Search
CPC ............................ H01L 23/36; H01L 21/4875
USPC ......................................... 257/785, 707, 719
See application file for complete search history.

(56) References Cited

U.S. PATENT DOCUMENTS 6,380,622 B1   4/2002   Hirai et al.
6,845,012 B2 *  1/2005   Ohkouchi .................... 361/704
(Continued)

FOREIGN PATENT DOCUMENTS

EP   1030354    8/2000
JP   02-39556   2/1990
(Continued)

OTHER PUBLICATIONS

Japanese Office Action, Apr. 7, 2015; Japanese Patent Application No. 2014-500063 (3 pages).

*Primary Examiner* — Luan C Thai
(74) *Attorney, Agent, or Firm* — Hamre, Schumann, Mueller & Larson, P.C.

(57) ABSTRACT

A semiconductor device (1) includes: a semiconductor chip (2) having a first main surface and a second main surface opposite to the first main surface; a heat dissipating plate (3) opposed to the first main surface; a first electrode (5) disposed between the first main surface and the heat dissipating plate (3) so as to be electrically connected to the semiconductor chip (2); a pressure contact member (4) opposed to the second main surface; a second electrode (6) disposed between the second main surface and the pressure contact member (4) so as to be electrically connected to the semiconductor chip (2); and a pressure generating mechanism that generates a pressure for pressing the first electrode (5) into contact with the heat dissipating plate (3) and the semiconductor chip (2) and pressing the second electrode (6) into contact with the pressure contact member (4) and the semiconductor chip (2).

13 Claims, 26 Drawing Sheets

(51) Int. Cl.
   *H01L 23/10*          (2006.01)
   *H01L 23/36*          (2006.01)
   *H01L 23/40*          (2006.01)
   *H01L 23/492*         (2006.01)
   *H01L 23/051*         (2006.01)
   *H01L 23/00*          (2006.01)
   *H01L 21/48*          (2006.01)
   *H01L 23/24*          (2006.01)

(52) U.S. Cl.
   CPC ..... *H01L23/051* (2013.01); *H01L 2224/48091* (2013.01); *H01L 2224/73265* (2013.01); *H01L 2924/13055* (2013.01); *H01L 2924/13091* (2013.01); *H01L 24/72* (2013.01); *H01L 23/24* (2013.01); *H01L 24/05* (2013.01); *H01L 24/06* (2013.01); *H01L 2224/05644* (2013.01); *H01L 2224/05655* (2013.01); *H01L 2224/0603* (2013.01); *H01L 2224/06181* (2013.01); *H01L 2924/10272* (2013.01); *H01L 2924/1033* (2013.01); *H01L 2924/1305* (2013.01); *H01L 2924/00013* (2013.01); *H01L 21/4875* (2013.01); *H01L 2224/03005* (2013.01); *H01L 24/03* (2013.01); *H01L 2224/03003* (2013.01); *H01L 2224/05639* (2013.01); *H01L 2924/1203* (2013.01); *H01L 2924/15153* (2013.01); *H01L 23/4093* (2013.01)

(56) References Cited

U.S. PATENT DOCUMENTS

| | | | |
|---|---|---|---|
| 6,885,096 B2 * | 4/2005 | Hirahara et al. | 257/692 |
| 7,042,086 B2 * | 5/2006 | Shimoida et al. | 257/724 |
| 7,456,492 B2 * | 11/2008 | Mochida | 257/659 |
| 2009/0116197 A1 * | 5/2009 | Funakoshi et al. | 361/719 |
| 2010/0102431 A1 | 4/2010 | Atsumi | |

FOREIGN PATENT DOCUMENTS

| | | |
|---|---|---|
| JP | 02-89352 | 3/1990 |
| JP | 2001-102400 | 4/2001 |
| JP | 2002-270746 | 9/2002 |
| JP | 2003-188346 | 7/2003 |
| JP | 2005-150596 | 6/2005 |
| JP | 2007-242962 | 9/2007 |
| JP | 2009-117428 | 5/2009 |
| WO | 99/12197 | 3/1999 |
| WO | WO 2008/123386 | 10/2008 |

\* cited by examiner (a)

FIG. 12A
FIG. 12C
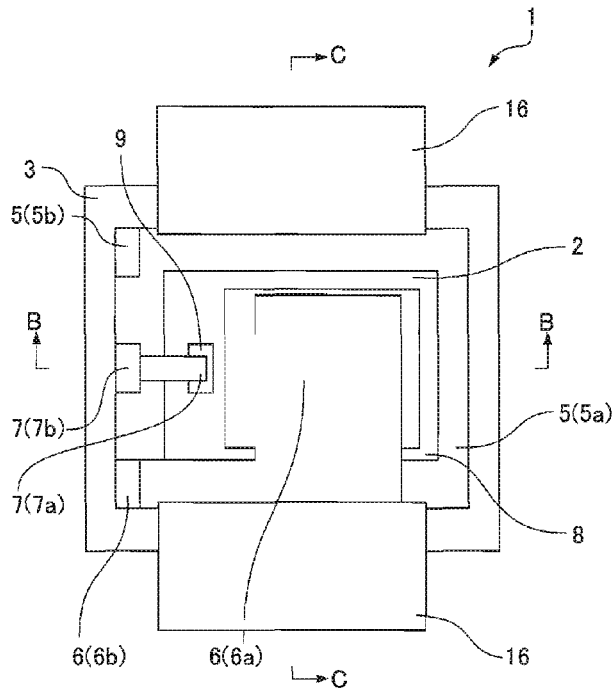
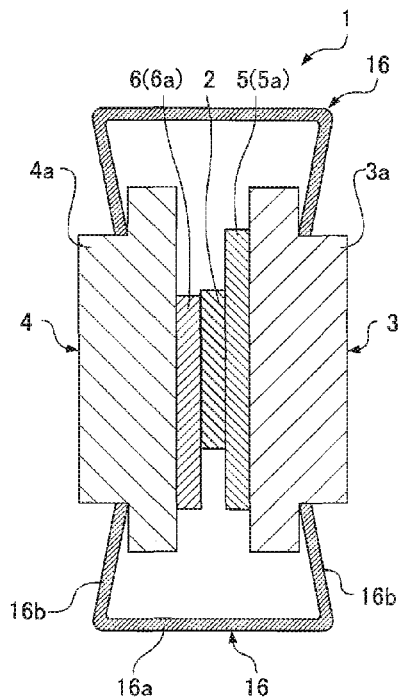
FIG. 12B
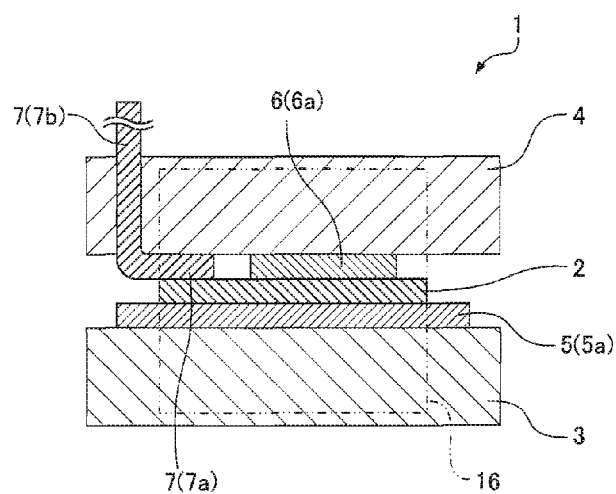

SEMICONDUCTOR DEVICE AND METHOD FOR MANUFACTURING THE SAME

TECHNICAL FIELD

The present invention relates to a semiconductor device and a method for manufacturing the same, and particularly relates to a semiconductor device applicable to high-power semiconductor devices (power modules) such as an IGBT module and a power MOSFET module and a method for manufacturing the same.

BACKGROUND ART

Non-Patent Literature 1 discloses a power module. In the power module, one main surface (underside) of a power device (semiconductor chip) is fixed to a heat spreader with solder while surface electrodes formed on another main surface (top surface) of the power device are directly fixed to the inner leads of a lead frame with solder.

FIG. 35 is a cross-sectional view schematically showing the structure of a power module 101 disclosed in Non-Patent Literature 1. In the power module 101, a surface electrode (not shown) formed on the top surface of a power device 102 is directly fixed to a main terminal 103 via a solder layer 104. Moreover, another surface electrode (not shown) formed on the top surface of the power device 102 is electrically and mechanically connected to a control terminal 105 via a wire (thin metallic wire) 106. The underside of the power device 102 is fixed to a heat spreader (metal block) 108 via a solder layer 107. The underside of the heat spreader 108 is fixed to a metal layer 110 via an insulating sheet 109 made of an insulating resin. The constituent elements of the power module 101 are molded with a mold resin 111. The main terminal 103 and the control terminal 105 partially protrude from the outside shape of the mold resin 111.

Patent Literature 1-discloses another power module. The power module includes an insulating substrate made of an insulating material such as ceramic between a semiconductor chip and a heat dissipating plate.

FIG. 36 is a cross-sectional view schematically illustrating the structure of a power module 201 disclosed in Patent Literature 1. In the power module 201, an electric conductor 203a is formed on one surface (top surface) of an insulating substrate 203. A semiconductor chip 202 is fixed to the surface of the electric conductor 203a via a solder layer 204. The insulating substrate 203 is made of an insulating material, e.g., ceramic. Another electric conductor 203b is formed on another surface (underside) of the insulating substrate 203. The surface of the electric conductor 203b is fixed via a solder layer 206 to a heat dissipating plate 205 disposed below the semiconductor chip 202.

CITATION LIST

Patent Literatures

Patent Literature 1: WO2008/23386

Non-Patent Literature

Non-patent Literature 1: "Direct lead bonded high performance power module", Mitsubishi Electric Corporation Technical Report, 84(4), p. 232, 2010-04, Masao Kikuchi and four others

SUMMARY OF INVENTION

Technical Problem

Generally, semiconductor chips mounted in power modules are made of Si (silicon). Moreover, in recent years, semiconductor chips made of SiC (silicon carbide) or GaN (gallium nitride) have been developed. A feature of a semiconductor chip made of SiC or GaN is the capability of operating at high temperatures. Specifically, a semiconductor chip made of Si cannot operate at a temperature exceeding 150° C., whereas a semiconductor chip made of SiC or GaN can operate at 300° C. or higher. Thus, a power module including a semiconductor chip made of SiC or GaN needs to respond to a higher temperature than a power module including a semiconductor chip made of Si.

However, the structures of the power modules disclosed in Non-Patent Literature 1 and Patent Literature 1 cannot respond to high temperatures.

Specifically, in the case of the power device 102 made of SiC in the structure of the power module 101 disclosed in Non-Patent Literature 1, the power device 102 has a thermal expansion coefficient of 3 ppm/° C. to 4 ppm/° C., If the main terminal 103 and the heat spreader 108 are both made of copper (Cu), the main terminal 103 and the heat spreader 108 have a thermal expansion coefficient of 17 ppm/° C. Thus, a stress depending upon the temperature change of the power device 102 is generated on the solder layer (joining part) 104 that joins the main terminal 103 and the power device 102 and the solder layer (joining part) 107 that joins the heat spreader 108 and the power device 102. The stress increases with the temperature of the power device 102. Hence, a stress load applied to the joining parts (the solder layers 104 and 107) increases with the temperature change of the power device 102. For this reason, if the power device 102 is made of SiC and reaches a higher temperature than a semiconductor chip made of Si during an operation of the power module 101, a stress is repeatedly generated on the joining part. This may break the joining part so as to cause faulty connection or deterioration of thermal resistance.

In the structure of the power module 201 disclosed in Patent Literature 1, if the heat dissipating plate 205 is made of copper(Cu), the heat dissipating plate 205 has a thermal expansion coefficient of 17 ppm/° C. If the insulating substrate 203 is made of aluminum nitride (AlN), the insulating substrate 203 has a thermal expansion coefficient of 4 ppm/° C. Thus, a stress depending upon the temperature change of the semiconductor chip 202 is generated on the solder layer (joining part) 206 that joins the insulating substrate 203 and the heat dissipating plate 205. The stress increases with the temperature of the semiconductor chip 202, causing a stress load applied to the joining part (solder layer 206) to increase with the temperature change of the semiconductor chip 202. Hence, if the semiconductor chip 202 is made of, for example, SiC and the temperature of the semiconductor chip 202 is higher than that of a semiconductor chip made of Si during an operation of the power module 201, a stress is repeatedly generated on the joining part. This may break the joining part so as to deteriorate thermal resistance.

An object of the present invention is to provide a reliable semiconductor device even if the temperature of the semiconductor chip considerably changes. Another object of the present invention is to provide a method for manufacturing a reliable semiconductor device even if the temperature of the semiconductor chip considerably changes.

Solution to Problem

An aspect of a semiconductor device according to the present invention includes: a semiconductor chip having a first main surface and a second main surface opposite to the first main surface; a heat dissipating plate opposed to the first main surface; a first electrode disposed between the first main surface and the heat dissipating plate so as to be electrically connected to the semiconductor chip; a pressure contact member opposed to the second main surface; a second electrode disposed between the second main surface and the pressure contact member so as to be electrically connected to the semiconductor chip; and a pressure generating mechanism that generates a pressure for pressing the first electrode into contact with the heat dissipating plate and the semiconductor chip and pressing the second electrode into contact with the pressure contact member and the semiconductor chip.

According to another aspect of the semiconductor device of the present invention, the first electrode has a portion in contact with the semiconductor chip and the semiconductor chip has a portion in contact with the first electrode such that the portion of the first electrode has higher surface roughness than the portion of the semiconductor chip.

Another aspect of the semiconductor device of the present invention further includes an insulating element for providing insulation between the heat dissipating plate and the first electrode, the heat dissipating plate being made of one of copper and aluminum.

According to another aspect of the semiconductor device of the present invention, the first electrode has a surface opposed to the first main surface of the semiconductor chip such that the surface of the first electrode opposed to the first main surface has a larger area than the first main surface, and the semiconductor chip is disposed such that the surface of the first electrode opposed to the first main surface is placed out of the outer periphery of the first main surface projected to the surface of the first electrode opposed to the first main surface.

According to another aspect of the semiconductor device of the present invention, the heat dissipating plate has a first concave portion that is opened near the first main surface of the semiconductor chip, and at least a part of the first electrode disposed between the first main surface and the heat dissipating plate is placed in the first concave portion.

According to another aspect of the semiconductor device of the present invention, the first electrode has a second concave portion that is opened near the first main surface of the semiconductor chip, and a part of the semiconductor chip is placed in the second concave portion.

According to another aspect of the semiconductor device of the present invention, the pressure contact member is a second heat dissipating plate.

Another aspect of the semiconductor device of the present invention further includes an insulating element for providing insulation between the second heat dissipating plate and the second electrode, the second heat dissipating plate being made of one of copper and aluminum.

According to another aspect of the semiconductor device of the present invention, the heat dissipating plate is made of one of diamond and ceramic.

According to another aspect of the semiconductor device of the present invention, the heat dissipating plate is made of one of aluminum nitride, silicon nitride, and alumina.

According to another aspect of the semiconductor device of the present invention, the second heat dissipating plate is made of one of diamond and ceramic.

According to another aspect of the semiconductor device of the present invention, the second heat dissipating plate is made of one of aluminum nitride, silicon nitride, and alumina.

Another aspect of the semiconductor device of the present invention further includes a third electrode that is disposed at a different place from the second electrode between the pressure contact member and the semiconductor chip, is electrically connected to the semiconductor chip, and is pressed into contact with the pressure contact member and the semiconductor chip by the pressure generating mechanism, the pressure generating mechanism generating a pressure such that a pressure applied to the second electrode is larger than a pressure applied to the third electrode.

According to another aspect of the semiconductor device of the present invention, the semiconductor chip has one of an emitter electrode, a source electrode, and an anode electrode as a surface electrode formed on the second main surface, the second electrode is electrically connected to one of the emitter electrode, the source electrode, and the anode electrode, and a pressure applied to the second electrode by the pressure generating mechanism is at least 0.5 MPa and less than 30 MPa.

An aspect of a method for manufacturing a semiconductor device includes: disposing a first electrode on a heat dissipating plate; disposing a semiconductor chip on the first electrode; disposing a second electrode on the semiconductor chip; disposing a pressure contact member on the second electrode; and applying a pressure from the heat dissipating plate and the pressure contact member to the semiconductor chip so as to press the first electrode into contact with the semiconductor chip and press the second electrode into contact with the semiconductor chip.

Advantageous Effects of Invention

According to the present invention, connection reliability improves between a semiconductor chip and an electrode electrically connected to the semiconductor chip. Thus, a reliable semiconductor device can be obtained.

BRIEF DESCRIPTION OF DRAWINGS

FIG. 12A is a plan view schematically showing a third structural example of the pressure generating mechanism provided in the semiconductor device according to the embodiment of the present invention.

FIG. 12B is a cross-sectional view schematically showing the third structural example of the pressure generating mechanism provided in the semiconductor device according to the embodiment of the present invention.

FIG. 12C is a cross-sectional view taken along a different direction so as to schematically show the third structural example of the pressure generating mechanism provided in the semiconductor device according to the embodiment of the present invention.

DESCRIPTION OF EMBODIMENTS

Figure 1A:
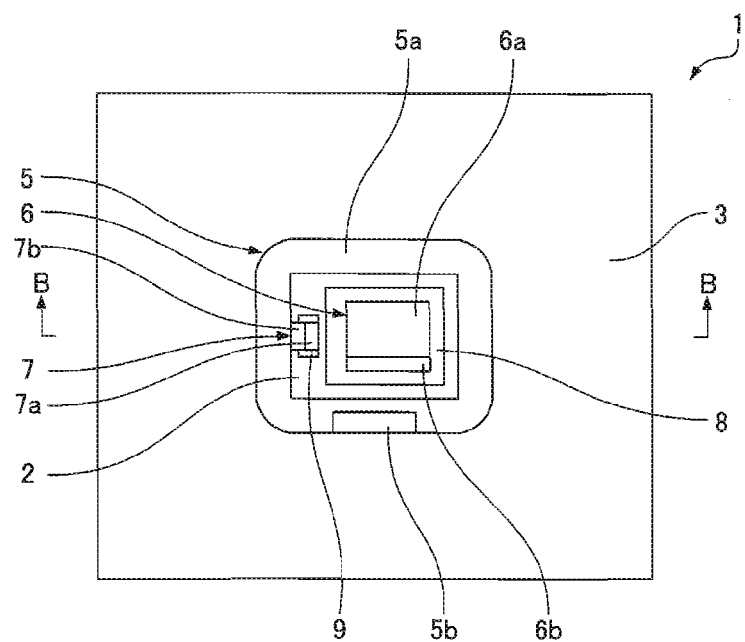
FIG. 1A is a plan view schematically showing a first structural example of a semiconductor device according to an embodiment of the present invention.

An embodiment of the present invention, for example, a power module (high-power semiconductor device or a power semiconductor device) will be described below with reference to the accompanying drawings. For simple explanation, substantially the same constituent elements are indicated by the same reference numerals and a redundant explanation may be omitted. The constituent elements are schematically shown in the drawings to enhance understanding. The illustrated constituent elements are different in dimension (including a thickness and a length) and shape from actual constituent elements for the creation of the drawings. The materials, shapes, numbers, and dimensions of the constituent elements in the following embodiment are merely exemplary and are not particularly limited. Hence, the constituent elements can be changed in various ways without substantially departing from the effect of the present invention.

Figure 1B:
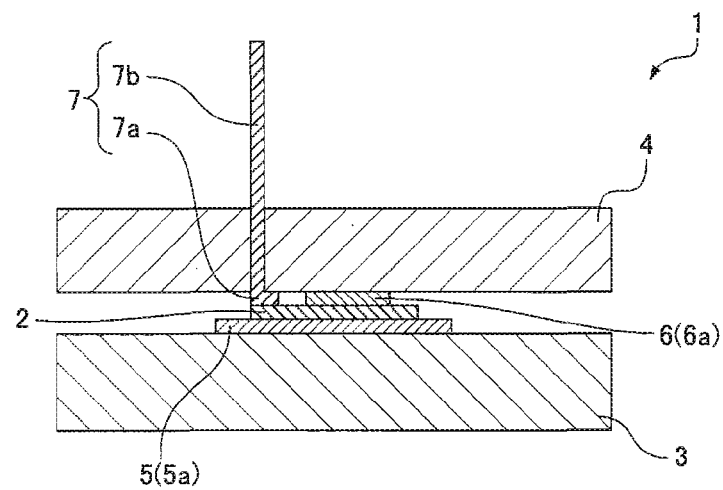
FIG. 1B is a cross-sectional view schematically showing the first structural example of the semiconductor device according to the embodiment of the present invention.
Figure 2:
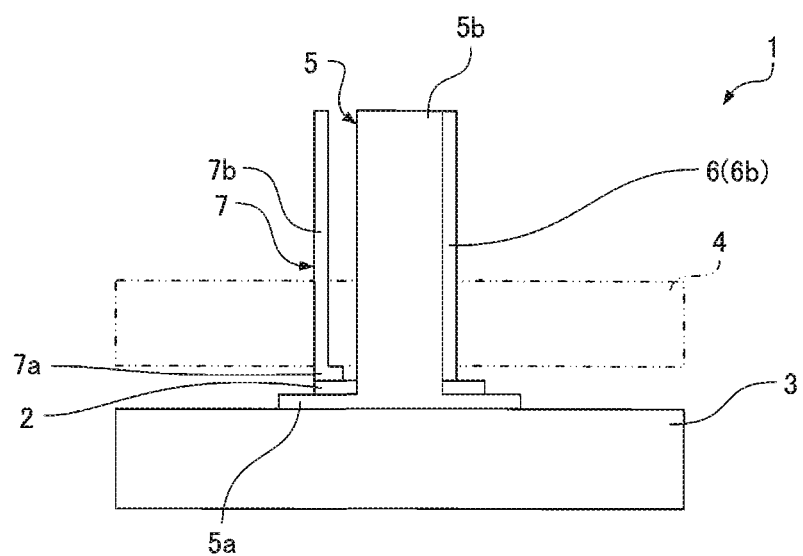
FIG. 2 is a front view schematically showing the first structural example of the semiconductor device according to the embodiment of the present invention.

Referring to FIGS. 1A, 1B, and 2, the outline of a semiconductor device (power module) 1 will be described below according to the embodiment of the present invention. FIG. 1A is a plan view schematically showing a structural example of the semiconductor device 1 of the present embodiment. FIG. 1B is a cross-sectional view taken along the line B-B of FIG. 1A. FIG. 1A does not illustrate an upper heat dissipating plate 4 that is an example of a pressure contact member. FIG. 2 is a front view schematically showing a structural example of the semiconductor device 1 according to the present embodiment. In FIG. 2, the upper heat dissipating plate 4 is indicated by a virtual line (chain double-dashed line).

As shown in FIGS. 1A, 1B, and 2, the semiconductor device 1 includes a semiconductor chip 2. In the present embodiment, the semiconductor chip 2 is a power semiconductor chip.

The semiconductor device 1 further includes a lower heat dissipating plate (first heat dissipating plate) 3 disposed below the semiconductor chip 2 and the upper heat dissipating plate (second heat dissipating plate) 4 disposed above the semiconductor chip 2. Thus, the upper heat dissipating plate 4 is opposed to the lower heat dissipating plate 3 and the semiconductor chip 2 is disposed between the lower heat dissipating plate 3 and the upper heat dissipating plate 4. The heat dissipating plates 3 and 4 are preferably made of a highly thermally conductive material having high thermal conductivity. The semiconductor device 1 further includes a first electrode 5, a second electrode 6, and a third electrode 7.

The first electrode 5 is disposed on the top surface of the lower heat dissipating plate 3 so as to face the first main surface (underside) of the semiconductor chip 2. The first electrode 5 has a pressing portion 5a in contact with the lower heat dissipating plate 3 and a projecting portion 5b that extends from the pressing portion 5a. The semiconductor chip 2 is disposed on the top surface of the pressing portion 5a of the first electrode 5. The top surface of the pressing portion 5a is opposite from the underside of the pressing portion 5a (first electrode 5), the underside facing the lower heat dissipating plate 3. Thus, the first electrode 5 is disposed between the semiconductor chip 2 and the lower heat dissipating plate 3.

The projecting portion 5b of the first electrode 5 projects from a predetermined position, which is located away from the projection region of the semiconductor chip 2, to the upper heat dissipating plate 4. The projecting portion 5b of the first electrode 5 extends from the pressing portion 5a of the first electrode 5 so as to project from the top surface of the upper heat dissipating plate 4. The top surface of the upper heat dissipating plate 4 is opposite from the underside of the upper heat dissipating plate 4, the underside facing the semiconductor chip 2. Thus, the upper heat dissipating plate 4 has a hole (not shown) allowing the insertion of the projecting portion 5b of the first electrode 5.

The pressing portion 5a of the first electrode 5 faces a first surface electrode (not shown) formed on the underside of the semiconductor chip 2 and is electrically connected to the first surface electrode, which is not shown. For example, the first surface electrode (not shown) formed on the underside of the semiconductor chip 2 may be a flat electrode formed substantially over the underside of the semiconductor chip 2. The pressing portion 5a of the first electrode 5 is pressed to the semiconductor chip 2 and the lower heat dissipating plate 3 by a pressure generating mechanism, which is not shown, so as to be joined in contact with the semiconductor chip 2 and the lower heat dissipating plate 3. The pressure generating mechanism, which is not shown, generates a pressure that presses and joins the pressing portion 5a of the first electrode 5 to the semiconductor chip 2 and the lower heat dissipating plate 3.

The second electrode 6 and the third electrode 7 are located at different places on the top surface (second main surface) of the semiconductor chip 2. The top surface of the semiconductor chip 2 is opposite from the first main surface (underside) of the semiconductor chip 2. In the semiconductor device 1, the regions of the electrodes 6 and 7 projected on the top surface of the semiconductor chip 2 are centered so as to be deviated from the center of the top surface of the semiconductor chip 2. Like the first electrode 5 disposed on the underside of the semiconductor chip 2, the electrodes 6 and 7 have pressing portions 6a and 7a in contact with the semiconductor chip 2 and projecting portions 6b and 7b projecting from the pressing portions 6a and 7a.

The upper heat dissipating plate 4 is disposed on the top surfaces of the pressing portions 6a and 7a of the electrodes 6 and 7. The top surfaces of the pressing portions 6a and 7a are opposite from the undersides of the pressing portions 6a and 7a (electrodes 6 and 7) that face the semiconductor chip 2. Thus, the second electrode 6 and the third electrode 7 are both disposed between the semiconductor chip 2 and the upper heat dissipating plate 4. The upper heat dissipating plate 4 opposed to the top surface of the semiconductor chip 2 continuously hold the semiconductor chip 2 and the pressing portions 5a to 7a of the electrodes 5 to 7 with the lower heat dissipating plate 3 opposed to the underside of the semiconductor chip 2.

The projecting portion 6b of the second electrode 6 extends from the pressing portion 6a of the second electrode 6 so as to project from the top surface of the upper heat dissipating plate 4. Similarly, the projecting portion 7b of the third electrode 7 also extends from the pressing portion 7a of the third electrode 7 so as to project from the top surface of the upper heat dissipating plate 4. Thus, the upper heat dissipating plate 4 has a hole (not shown) allowing the insertion of the projecting portion 6b of the second electrode 6 and a hole allowing the insertion of the projecting portion 7b of the third electrode 7.

The pressing portion 6a of the second electrode 6 is opposed to a second surface electrode 8 formed on the top surface of the semiconductor chip 2, and is electrically connected to the second surface electrode 8. Similarly, the pressing portion 7a of the third electrode 7 is opposed to a third surface electrode 9 formed on the top surface of the semiconductor chip 2, and is electrically connected to the third surface electrode 9. The pressing portion 6a of the second electrode 6 and the pressing portion 7a of the third electrode 7 are both pressed to the semiconductor chip 2 and the upper heat dissipating plate 4 by the pressure generating mechanism, which is not shown, so as to be joined in contact with the semiconductor chip 2 and the upper heat dissipating plate 4. The pressure generating mechanism, which is not shown, generates a pressure that presses and joins the pressing portion 6a of the second electrode 6 and the pressing portion 7a of the third electrode 7 to the semiconductor chip 2 and the upper heat dissipating plate 4.

In the semiconductor device 1, the area of the second surface electrode 8 formed on the second main surface (top surface) of the semiconductor chip 2 is larger than that of the pressing portion 6a of the second electrode 6 (the projection area of the second electrode 6) in contact with the second surface electrode 8. The second surface electrode 8 is placed out of the pressing portion 6a of the second electrode 6 at least in one direction. With this configuration, even if the pressing portion 6a of the second electrode 6 and the semiconductor chip 2 slide relative to each other, electrical connection is kept between the second surface electrode 8 of the semiconductor chip 2 and the second electrode 6.

In the present embodiment, the second electrode 6 is in contact with the second surface electrode 8 of the semiconductor chip 2 in the structure of the semiconductor device 1. The semiconductor device is not, however, limited to the structure. For example, the second surface electrode 8 of the semiconductor chip 2 may be plated so as to form projecting electrodes having a height of, for example, about 4 μm on the second surface electrode 8. Specifically, if the second surface electrode 8 of the semiconductor chip 2 is made of, for example, Al (aluminum), the second surface electrode 8 may be coated with Ni. After the Ni coating is applied, the second surface electrode 8 may be further coated with Au by flash plating. The projecting electrodes are formed on the second surface electrode 8 of the semiconductor chip 2. Thus, when the pressing portion 6a of the second electrode 6 and the semiconductor chip 2 slide relative to each other, electrical connection can be kept between the second surface electrode 8 and the second electrode 6 regardless of whether the pressing portion 6a of the second electrode 6 has a larger area than the second surface electrode 8.

In the semiconductor device 1, at least in one direction, the third surface electrode 9 formed on the second main surface (top surface) of the semiconductor chip 2 is placed out of the pressing portion 7a of the third electrode 7 in contact with the third surface electrode 9. The pressing portion 7a of the third electrode 7 is also placed out of the third surface electrode 9 at least in one direction. If the electrode electrically connected to the surface electrode of the semiconductor chip is placed out of the surface electrode, the projecting electrode needs to be formed on the surface electrode of the semiconductor chip. In the semiconductor device 1, the projecting electrode (not shown) is formed on the third surface electrode 9 of the semiconductor chip 2 by plating. The pressing portion 7a of the third electrode 7 is disposed on the projecting electrode (not shown) formed by plating. With this configuration, even if the pressing portion 7a of the third electrode 7 and the semiconductor chip 2 slide relative to each other, electrical connection is kept between the third surface electrode 9 of the semiconductor chip 2 and the third electrode 7. If the projecting electrode is formed on the third surface electrode 9, a projecting electrode is preferably formed on the second surface electrode 8 of the semiconductor chip 2, which is electrically connected to the pressing portion 6a of the second electrode 6, by plating or the like such that the top surfaces of the pressing portion 6a of the second electrode 6 and the pressing portion 7a of the third electrode 7 are flush with each other.

In the present embodiment, the semiconductor device 1 including the two electrodes 6 and 7 disposed on the top surface of the semiconductor chip 2 will be described below. The present invention is not, however, limited to this structure. At least one electrode may be disposed on each main surface of the semiconductor chip 2.

Moreover, in the present embodiment, the semiconductor device 1 includes the upper heat dissipating plate 4 as a pressure contact member opposed to the lower heat dissipating plate 3 via the semiconductor chip 2. The pressure contact member is not, however, limited to a heating dissipating plate, that is, a member having thermal conductivity. The pressure contact member only needs to continuously press the pressing portions 5a to 7a of the electrodes 5 to 7, which are electrically connected to the semiconductor chip 2, into contact with the lower heat dissipating plate 3 and the semiconductor chip 2, and keep electrical insulation.

In the semiconductor device 1, the pressure generating mechanism (not shown) generates a pressure for holding the semiconductor chip 2 between the lower heat dissipating plate 3 and the upper heat dissipating plate 4. This pressure presses and joins the pressing portion 5a of the first electrode 5 into contact with the lower heat dissipating plate 3, presses and joins the pressing portion 5a of the first electrode 5 into contact with the semiconductor chip 2, presses and joins the pressing portion 6a of the second electrode 6 and the pressing portion 7a of the third electrode 7 into contact with the semiconductor chip 2, and presses and joins the pressing portion 6a of the second electrode 6 and the pressing portion 7a of the third electrode 7 into contact with the upper heat dissipating plate 4. Such pressurization can keep the positional relationship among the semiconductor chip 2, the first electrode 5, the second electrode 6, and the third electrode 7.

The constituent elements of the semiconductor device 1 will be specifically described below.

First, the semiconductor chip 2 will be discussed below. A representative semiconductor chip used for a power module is a power semiconductor chip, e.g., a power MOSFET, an IGET, a bipolar transistor, and a diode. In recent years, power semiconductor chips made of SiC (silicon carbide) or GaN (gallium nitride) have been developed. The structures of power semiconductor chips are categorized into a vertical type and a horizontal type. In the present embodiment, the semiconductor chip 2 is a vertical power MOSFET.

If the semiconductor chip 2 is a vertical power MOSFET, the first surface electrode formed on the underside (first main surface) of the semiconductor chip 2 is a drain electrode in the semiconductor device 1 of the present embodiment. If the semiconductor chip 2 is a vertical power MOSFET, the first surface electrode formed on the underside (first main surface) of the semiconductor chip 2 is a drain electrode in the semiconductor device 1 of the present embodiment. The drain electrode is electrically connected to the first electrode 5 disposed on the underside of the semiconductor chip 2. The second surface electrode 8 and the third surface electrode 9 that are formed on the top surface (second main surface) of the semiconductor chip 2 respectively act as a source electrode and a gate electrode. Thus, the source electrode 8 is electrically connected to the second electrode 6 while the gate electrode 9 is electrically connected to the third electrode 7.

If the semiconductor chip 2 is an IGBT in the semiconductor device 1 of the present embodiment, the first surface electrode formed on the underside of the semiconductor chip 2 is a collector electrode. The second surface electrode 8 and the third surface electrode 9 formed on the top surface of the semiconductor chip 2 respectively act as an emitter electrode and a gate electrode. The emitter electrode 8 is electrically connected to the second-electrode 6 while the gate electrode 9 is electrically connected to the third electrode 7.

If the semiconductor chip 2 is a bipolar transistor in the semiconductor device 1 of the present embodiment, the first surface electrode formed on the underside of the semiconductor chip 2 is a collector electrode and the second surface electrode 8 and the third surface electrode 9 that are formed on the top surface of the semiconductor chip 2 respectively act as an emitter electrode and a base electrode. The emitter electrode 8 is electrically connected to the second electrode 6 while the base electrode 9 is electrically connected to the third electrode 7.

If the semiconductor chip is a diode, a cathode electrode is formed as a surface electrode on one main surface of the semiconductor chip while an anode electrode is formed as a surface electrode on the other main surface of the semiconductor chip. If the semiconductor chip is a diode, one surface electrode is formed on each of the main surfaces of the semiconductor chip. Thus, in this case, one electrode is disposed on each of the main surfaces.

The first electrode 5, the second electrode 6, and the third electrode 7 will be described below. The electrodes 5 to 7 are electrical members that apply a current and keep a predetermined voltage.

Generally, the electrodes 5 to 7 electrically connected to the semiconductor chip 2 are made of copper. The material of the electrodes 5 to 7 is not limited to copper. The electrodes 5 to 7 may be made of materials such as nickel and aluminum or may include substrates that are made of materials such as copper and are coated with nickel. Alternatively, the electrodes may include substrates that are made of materials such as copper and are coated with silver or gold after being coated with nickel. Since the substrates made of materials such as copper are coated with nickel, the electrodes are less likely to be oxidized. Furthermore, the nickel coating is further coated with silver or gold, further reducing the possibility of oxidization of the electrodes.

As has been discussed, the electrodes 5 to 7 have the projecting portions 5b to 7b that extend to the outside of the external shape of the semiconductor device 1. The projecting portions 5b to 7b extend from different places without coming into contact with each other. The projecting portions 5b to 7b are preferably inserted into the holes on the upper heat dissipating plate 4 such that the holes have minimum areas in cross section. In the semiconductor device 1, the projecting portions 5b to 7b extend perpendicularly to the upper heat dissipating plate 4. This suppresses an increase in the cross-sectional areas of the holes on the upper heat dissipating plate 4, thereby improving the heat dissipation characteristics of the upper heat dissipating plate 4.

The first electrode 5, the second electrode 6, and the third electrode 7 may include projecting portions from the underside of the lower heat dissipating plate 3 instead of the projecting portions from the top surface of the upper heat dissipating plate 4. The lower heat dissipating plate 3 may replace the upper heat dissipating plate 4 so as to include holes allowing the insertion of the projecting portions. The underside of the lower heat dissipating plate 3 is opposite from the top surface of the lower heat dissipating plate 3.

The lower heat dissipating plate 3 and the upper heat dissipating plate 4 will be described below. The heat dissipating plates 3 and 4 are members that have the function of pressing the first electrode 5, the second electrode 6, and the third electrode 7 to the semiconductor chip 2 so as to hold the electrodes, the function of efficiently releasing heat from the semiconductor chip 2, and the function of keeping electrical insulation.

The heat dissipating plates 3 and 4 are preferably made of an insulating inorganic material having high thermal conductivity. Specifically, the heat dissipating plates 3 and 4 may be made of diamond or ceramics such as aluminum nitride (AlN), silicon nitride ($Si_3N_4$), and alumina ($Al_2O_3$).

The heat dissipating plates 3 and 4 may be made of a metal having high thermal conductivity and may be insulated from the electrodes 5 to 7 by an insulating element. Referring to FIGS. 3 to 9, the semiconductor device 1 will be discussed below, in which the heat dissipating plates 3 and 4 and the electrodes 5 to 7 that are insulated from each other by the insulating element.

Figure 3:
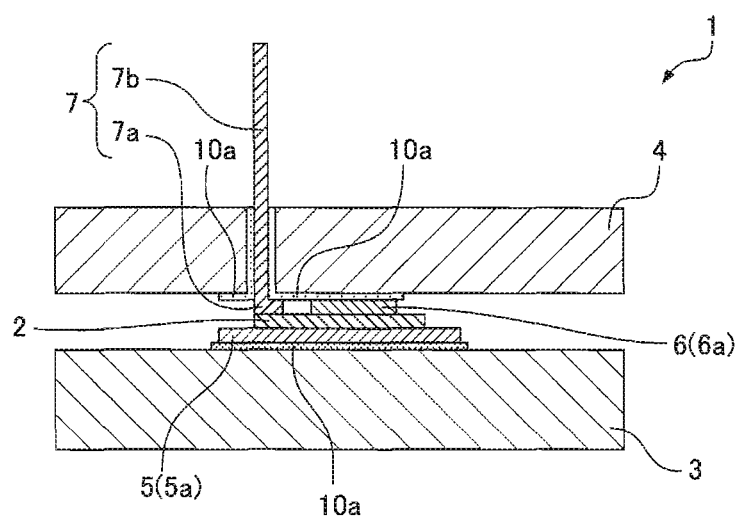
FIG. 3 is a cross-sectional view schematically showing a second structural example of the semiconductor device according to the embodiment of the present invention.
Figure 4:
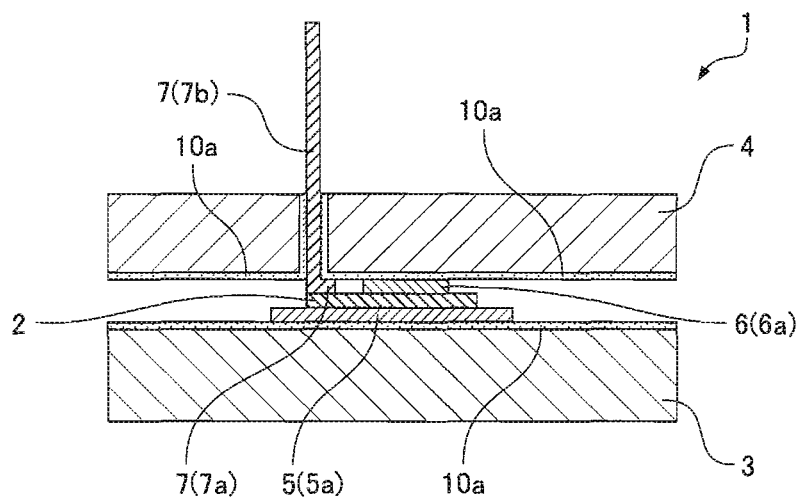
FIG. 4 is a cross-sectional view schematically showing a third structural example of the semiconductor device according to the embodiment of the present invention.

FIGS. 3 and 4 are cross-sectional views schematically illustrating another structural example of the semiconductor device 1 according to the present embodiment. In the semiconductor device 1 shown in FIGS. 3 and 4, an insulating layer 10a, which is an example of an insulating element, is formed on each of the top surface of the lower heat dissipating plate 3 and the underside of the upper heat dissipating plate 4. The insulating layer 10a is also formed on the inner surface of each hole of the upper heat dissipating plate 4 where the projecting portions 5b to 7b of the electrodes 5 to 7 are inserted. The insulating layer 10a formed on the top surface of the lower heat dissipating plate 3 provides insulation between the pressing portion 5a of the first electrode 5 and the lower heat dissipating plate 3. Similarly, the insulating layer 10a formed on the underside of the upper heat dissipating plate 4 provides insulation between the pressing portion 6a of the second electrode 6 and the upper heat dissipating plate 4 and between the pressing portion 7a of the third electrode 7 and the upper heat dissipating plate 4. This keeps electrical insulation between the heat dissipating plates 3 and 4 and the electrodes 5 to 7. Thus, the substrates of the heat dissipating plates 3 and 4 may be metallic members composed of aluminum, copper, and so on.

The insulating layer 10a is preferably made of an inorganic material that is highly thermally conductive. For example, the insulating layer 10a may be composed of an anodized film of aluminum (alumite), a diamond thin film, a film formed by ceramic spraying, diamond-like carbon, and so on.

For example, if the insulating layer 10a is made of alumite, the insulating layer 10a may be about 10 μm to 100 μm in thickness. If the insulating layer 10a is made of alumite, sealing is preferably performed on the insulating layer 10a in order to improve the insulation of the insulating layer 10a. An electrolyte used for alumite treatment is preferably an oxalic acid electrolyte. This is because the insulating layer 10a is less likely to be broken and has higher insulation. Moreover, an alumite surface may be coated with a resin film so as to further increase the insulation of the insulating layer 10a. The resin, film covering the insulating layer 10a may be about 1 μm to 20 μm. The resin film coating the resin layer 10a can be formed by, for example, electrodeposition of a fluorine-containing resin on the alumite surface after the alumite treatment.

The semiconductor device 1 including the insulating layer 10a made of an inorganic material on the metallic heat dissipating plate can be more inexpensively manufactured with higher thermal conductivity than the semiconductor device 1 including the heat dissipating plate made of an insulating inorganic material having high thermal conductivity.

The area of the insulating layer 10a formed on the top surface of the lower heat dissipating plate 3 is preferably larger than that of the pressing portion 5a of the first electrode 5 (the projection area of the first electrode 5) such that heat is efficiently released from the pressing portion 5a of the first electrode 5 to the lower heat dissipating plate 3. Since the area of the insulating layer 10a formed on the top surface of the lower heat dissipating plate 3 is larger than that of the pressing portion 5a of the first electrode 5, the lower heat dissipating plate 3 is reliably insulated from the pressing portion 5a of the first electrode 5. The area of the insulating layer 10a formed on the underside of the upper heat dissipating plate 4 may be larger than, for example, that of the top surface of the semiconductor chip 2 such that heat is efficiently released mainly from the pressing portion 6a of the second electrode 6 to the upper heat dissipating plate 4. Since the area of the insulating layer 10a formed on the underside of the upper heat dissipating plate 4 is larger than that of the top surface of the semiconductor chip 2, the pressing portions 6a and 7a of the electrodes 6 and 7 is reliably insulated from the upper heat dissipating plate 4.

In the semiconductor device 1 shown in FIG. 4, the area ratio of the insulating layer 10a to the top surface or underside of the heat dissipating plate 3 or 4 that faces the semiconductor chip 2 is different from that of the semiconductor device 1 shown in FIG. 3. Specifically, the area ratio of the insulating layer 10a in the semiconductor device 1 in FIG. 4 is larger than that of the insulating layer 10a in the semiconductor device 1 in FIG. 3. Thus, if the semiconductor device 1 shown in FIG. 3 has the same dimensions as the semiconductor device 1 in FIG. 4, the insulating layer 10a formed on the top surface or underside of the heat dissipating plate 3 or 4 of the semiconductor device 1 in FIG. 4 has a larger area than the insulating layer 10a formed on the top surface or underside of the heat dissipating plate 3 or 4 of the semiconductor device 1 in FIG. 3. As shown in FIG. 4, the insulating layer 10a is formed over or substantially over the top surface of the lower heat dissipating plate 3 and the insulating layer 10a is formed over or substantially over the top surface of the upper heat dissipating plate 4. Hence, the insulating layer 10a is more easily formed than the insulating layer 10a partially formed on the top surface or the underside of the heat dissipating plate 3 or 4, as shown in FIG. 3.

Another example of the semiconductor device 1 including the insulating element providing insulation between the heat dissipating plates 3 and 4 and the electrodes 5 to 7 will be described below. FIGS. 5 to 9 are cross-sectional views schematically showing another structural example of the semiconductor device 1 according to the present embodiment.

Figure 5:
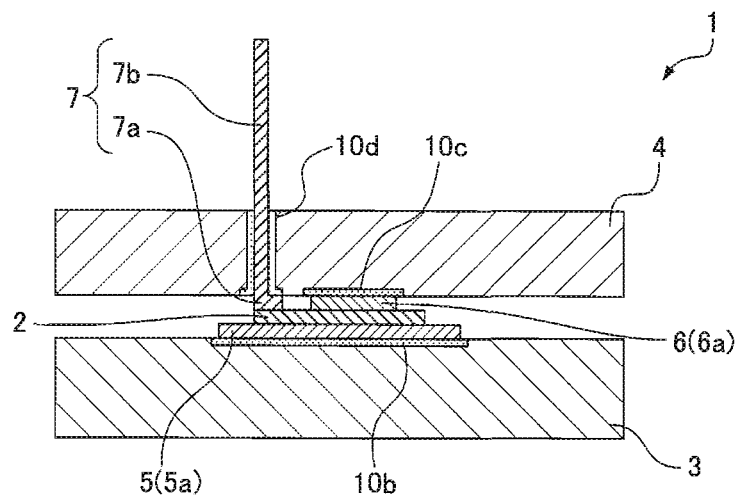
FIG. 5 is a cross-sectional view schematically showing a fourth structural example of the semiconductor device according to the embodiment of the present invention.

In the semiconductor device 1 shown in FIG. 5, as the heat dissipating plates 3 and 4 including insulating layers, the heat dissipating plates 3 and 4 contain embedded insulating members 10b, 10c, and 10d serving as examples of the insulating elements. The embedded insulating members 10b, 10c, and 10d form the insulating layers in the heat dissipating plates 3 and 4.

The insulating member 10b embedded in the lower heat dissipating plate 3 is exposed from the top surface of the lower heat dissipating plate 3, at a position corresponding to the pressing portion 5a of the first electrode 5.

The insulating member 10c embedded in the upper heat dissipating plate 4 is exposed from the underside of the upper heat dissipating plate 4, at a position corresponding to the pressing portion 6a of the second electrode 6. The shape of the insulating member 10c embedded in the upper heat dissipating plate 4 corresponds to the shape of the second electrode 6. Specifically, the insulating member 10c includes a base portion corresponding to the pressing portion 6a of the second electrode 6 and a projecting portion (not shown) corresponding to the projecting portion 6b of the second electrode 6. The underside of the base portion of the insulating member 10c is exposed from the underside of the upper heat dissipating plate 4, and the projecting portion of the insulating member 10c extends to the top surface of the upper heat dissipating plate 4 from the base portion of the insulating member 10c. Furthermore, a hole (not shown) extends from the underside of the base portion of the insulating member 10c to the end face of the projecting portion of the insulating member 10c so as to allow the insertion of the projecting portion 6b of the second electrode 6.

Similarly, the shape of the insulating member 10d embedded in the upper heat dissipating plate 4 corresponds to the shape of the third electrode 7. The insulating member 10d includes a base portion corresponding to the pressing portion 7a of the third electrode 7 and a projecting portion corresponding to the projecting portion 7b of the third electrode 7. The insulating member 10d is disposed at a position corresponding to the pressing portion 7a of the third electrode 7 such that the underside of the base portion of the insulating member 10d is exposed from the underside of the upper heat dissipating plate 4. The projecting portion of the insulating member 10d extends from the base portion of the insulating member 10d to the top surface of the upper heat dissipating plate 4. Furthermore, a hole extends from the underside of the base portion of the insulating member 10d to the end face of the projecting portion of the insulating member 10d so as to allow the insertion of the projecting portion 7b of the third electrode 7.

Moreover, an insulating member (not shown) having a hole is embedded in the upper heat dissipating plate 4 so as to insert the projecting portion 5b of the first electrode 5 into the hole. The insulating member may be combined with the insulating member 10c.

The insulating member 10b may be fit into a concave portion formed on the lower heat dissipating plate 3 by, for example, spot facing. Similarly, the base portions of the insulating members 10c and 10d may be fit into concave portions formed on the upper heat dissipating plate 4 by spot facing and so on. The insulating members 10b, 10c, and 10d embedded into the heat dissipating plates 3 and 4 do not displace the insulating members 10b, 10c, and 10d.

High thermal conductivity and high heat resistance are required for the insulating member 10b that provides insulation between the first electrode 5 pressed to the main electrode formed on the first main surface of the semiconductor chip 2 and the lower heat dissipating plate 3. Similarly, high thermal conductivity and high heat resistance are required for the insulating member 10c that provides insulation between the pressing portion 6a of the second electrode 6 pressed to the main electrode formed on the second main surface of the semiconductor chip 2 and the upper heat dissipating plate 4. Thus, the insulating members 10b and 10c are preferably made of inorganic insulating materials, for example, diamond or ceramics such as aluminum nitride (AlN) and silicon nitride ($Si_3N_4$). If high thermal dissipation is not necessary, inexpensive ceramics such as alumina ($Al_2O_3$) may be used.

For example, if the insulating member 10b is made of aluminum nitride, the insulating member 10b requires a thickness of about 50 μm to 1000 μm. The insulating member 10b preferably has a thickness of about 400 Similarly, if the insulating member 10c is made of aluminum nitride, the base portion of the insulating member 10c requires a thickness of about 50 μm to 1000 μm. The base portion of the insulating member 10c preferably has a thickness of about 400 μm. If the insulating member 10b is made of diamond, the insulating member 10b requires a thickness of about 10 μm to 100 μm. Similarly, if the insulating member 10c is made of diamond, the base portion of the insulating member 10c requires a thickness of about 10 μm to 100 μm. The diamond may be polycrystalline diamond or single crystal diamond.

For the insulating member 10d that provides insulation between the third electrode 7 pressed to the gate electrode of the semiconductor chip 2 and the upper heat dissipating plate 4, only insulation is required. Thus, the insulating member 10d may be made of inexpensive inorganic materials, for example, ceramics such as mica and alumina ($Al_2O_3$). Also for the insulating member (not shown) that provides insulation between the projecting portion 5b of the first electrode 5 and the upper heat dissipating plate 4, only insulation is necessary. If the insulating member that provides insulation between the projecting portion 5b of the first electrode 5 and the upper heat dissipating plate 4 is not combined with the insulating member 10c, the insulating member (not shown) that provides insulation between the projecting portion 5b of the first electrode 5 and the upper heat dissipating plate 4 may be made of inexpensive inorganic materials, for example, ceramics such as mica and alumina ($Al_2O_3$).

The heat dissipating plates 3 and 4 are preferably made of inexpensive metallic materials having high thermal conductivity. For example, aluminum or copper is preferable. The insulating members 10b to 10d can be machined into predetermined shapes by, for example, cutting or grinding. If the insulating members 10b to 10d are made of ceramics, the insulating members may be molded into the predetermined shapes without machining.

The area of the insulating member 10b is preferably larger than that of the pressing portion 5a of the first electrode 5 so as to reliably provide insulation between the lower heat dissipating plate 3 and the pressing portion 5a of the first electrode 5. Similarly, the area of the base portion of the insulating member 10c (the projection area of the insulating member 10c) is preferably larger than that of the pressing portion 6a of the second electrode 6. The area of the base portion of the insulating member 10d (the projection area of the insulating member 10d) is preferably larger than that of the pressing portion 7a of the third electrode 7 (the projection area of the third electrode 7).

Instead of the insulating members 10b, 10c, and 10d embedded in the heat dissipating plates 3 and 4, an anodized film of aluminum (alumite), a diamond thin film, a film formed by ceramic spraying, diamond-like carbon, and so on may be formed in the concave portions formed on the heat dissipating plates 3 and 4 by, for example, spot facing.

Figure 6:
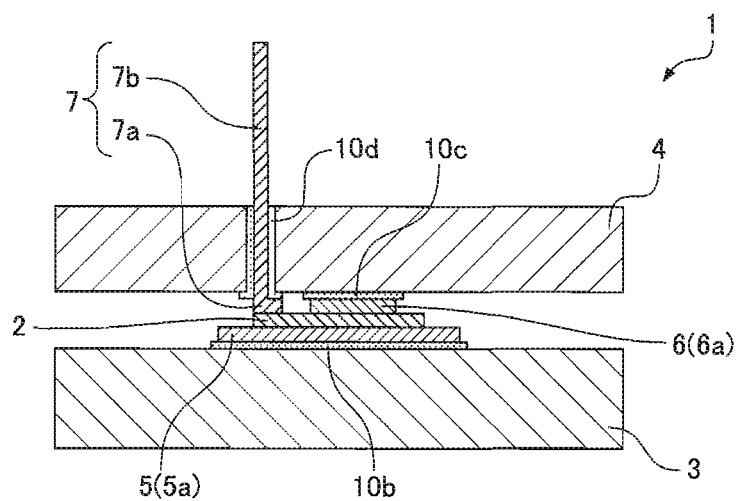
FIG. 6 is a cross-sectional view schematically showing a fifth structural example of the semiconductor device according to the embodiment of the present invention.

In the semiconductor device 1 shown in FIG. 6, the insulating member 10b is disposed on the top surface of the lower heat dissipating plate 3. The insulating member 10b disposed on the top surface of the lower heat dissipating plate 3 forms the insulating layer on the lower heat dissipating plate 3. The base portions of the insulating members 10c and 10d are disposed on the underside of the upper heat dissipating plate 4. The insulating members 10c and 10d disposed on the underside of the upper heat dissipating plate 4 form the insulating layers on the upper heat dissipating plate 4.

Unlike the semiconductor device 1 shown in FIG. 5, the semiconductor device 1 shown in FIG. 6 eliminates the need for the concave portions formed on the heat dissipating plates 3 and 4, thereby achieving low cost. The area of the insulating member 10b is preferably larger than that of the pressing portion 5a of the first electrode 5 such that heat is efficiently released from the pressing portion 5a of the first electrode 5 to the lower heat dissipating plate 3. Since the area of the insulating member 10b disposed on the top surface of the lower heat dissipating plate 3 is larger than that of the pressing portion 5a of the first electrode 5, the lower heat dissipating plate 3 and the pressing portion 5a of the first electrode 5 are reliably insulated from each other. Similarly, the base portion of the insulating member 10c disposed on the underside of the upper heat dissipating plate 4 preferably has a larger area than the pressing portion 6a. Moreover, the base portion of the insulating member 10d disposed on the underside of the upper heat dissipating plate 4 preferably has a larger area than the pressing portion 7a. Since the base portion of the insulating member 10c has a larger area than the pressing portion 6a and the base portion of the insulating member 10d has a larger area than the pressing portion 7a, the pressing portions 6a and 7a of the electrodes 6 and 7 and the upper heat dissipating plate 4 are reliably insulated from each other.

Figure 7:
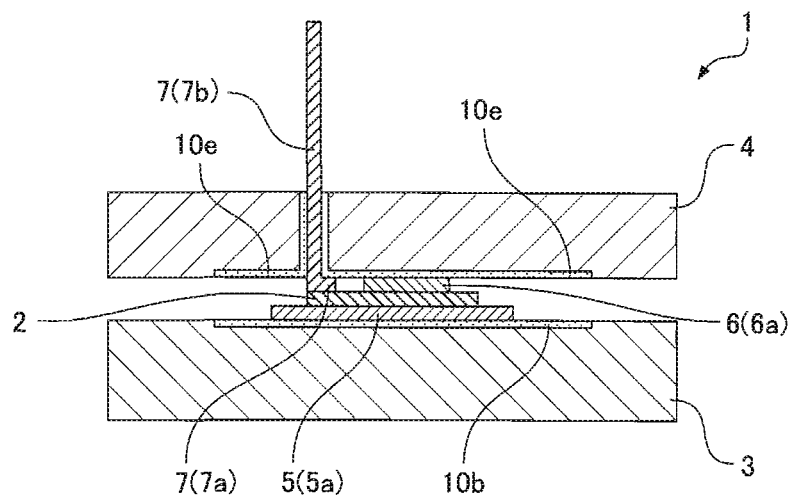
FIG. 7 is a cross-sectional view schematically showing a sixth structural example of the semiconductor device according to the embodiment of the present invention.

For example, as shown in FIG. 7, the insulating member that provides insulation between the second electrode 6 and the upper heat dissipating plate 4 and the insulating member that provides insulation between the third electrode 7 and the upper heat dissipating plate 4 may be combined with each other. FIG. 7 shows the semiconductor device 1 including the insulating member 10b embedded in the lower heat dissipating plate 3 and an insulating member 10e embedded in the upper heat dissipating plate 4. The insulating member 10e provides insulation between the second electrode 6 and the upper heat dissipating plate 4 and insulation between the third electrode 7 and the upper heat dissipating plate 4. The embedded insulating member 10e forms an insulating layer on the upper heat dissipating plate 4.

Specifically, the insulating member be includes a base portion covering the pressing portion 6a of the second electrode 6 and the pressing portion 7a of the third electrode 7, a projecting portion (not shown) corresponding to the projecting portion 6b of the second electrode 6, and a projecting portion corresponding to the projecting portion 7b of the third electrode 7. The underside of the base portion of the insulating member 10e is exposed from the underside of the upper heat dissipating plate 4, and the projecting portions of the insulating member 10e extend from the base portion of the insulating member 10e to the top surface of the upper heat dissipating plate 4. Furthermore, a hole (not shown) extends from the underside of the base portion of the insulating member 10e to the end face of one projecting portion of the insulating member 10e so as to allow the insertion of the projecting portion 6b of the second electrode 6. Moreover, a hole extends from the underside of the base portion of the insulating member 10e to the end face of the other projecting portion of the insulating member be so as to allow the insertion of the projecting portion 7b of the third electrode 7.

Furthermore, the insulating member (not shown) having the hole is embedded in the upper heat dissipating plate 4 so as to insert the projecting portion 5b of the first electrode 5 into the hole. The insulating member may be combined with the insulating member 10e.

The base portion of the insulating member 10e may be fit into a concave portion formed on the upper heat dissipating plate 4 by, for example, spot facing. The insulating member 10e embedded in the upper heat dissipating plate 4 does not displace the insulating member 10e.

In the semiconductor device 1 shown in FIG. 7, high thermal conductivity and high heat resistance are required for the insulating member 10e that provides insulation between the pressing portion 6a of the second electrode 6 and the upper heat dissipating plate 4. Thus, the insulating member 10e is preferably made of an inorganic insulating material, for example, diamond or ceramics such as aluminum nitride (AlN) and silicon nitride ($Si_3N_4$). If high thermal dissipation is not necessary, inexpensive ceramics such as alumina ($Al_2O_3$) may be used. For example, if the insulating member be is made of aluminum nitride, the base portion of the insulating member 10e requires a thickness of about 50 μm to 1000 μm. The base portion of the insulating member 10e preferably has a thickness of about 400 μm. If the insulating member 10e is made of diamond, the base portion of the insulating member be requires a thickness of about 10 μm to 100 μm. The diamond may be polycrystalline diamond or single crystal diamond.

The insulating member 10e can be machined into a predetermined shape by, for example, cutting or grinding. If the insulating member 10e is ceramic, the insulating member 10e may be molded into the predetermined shape without machining.

The area of the base portion of the insulating member be (the projection area of the insulating member 10e) may be larger than, for example, that of the top surface of the semiconductor chip 2 so as to reliably provide insulation between the pressing portions 6a and 7a of the electrodes 6 and 7 and the upper heat dissipating plate 4.

Instead of the insulating members 10b and 10e embedded in the heat dissipating plates 3 and 4, an anodized film of aluminum (alumite), a diamond thin film, a film formed by ceramic spraying, diamond-like carbon, and so on may be formed in the concave portions formed on the heat dissipating plates 3 and 4 by, for example, spot facing.

Figure 8:
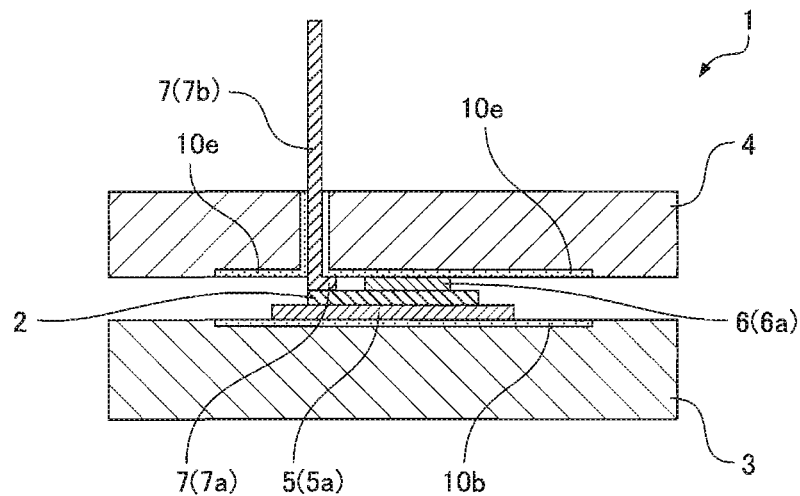
FIG. 8 is a cross-sectional view schematically showing a seventh structural example of the semiconductor device according to the embodiment of the present invention.
Figure 9:
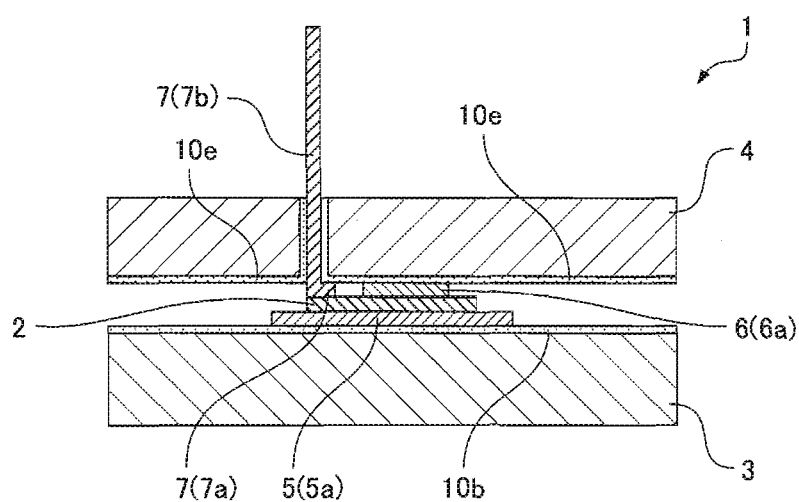
FIG. 9 is a cross-sectional view schematically showing an eighth structural example of the semiconductor device according to the embodiment of the present invention.

In the semiconductor devices 1 shown in FIGS. 8 and 9, the insulating member 10b is disposed on the top surface of the lower heat dissipating plate 3, and the base portion of the insulating member 10e is disposed on the underside of the upper heat dissipating plate 4. The insulating member 10e disposed on the underside of the upper heat dissipating plate 4 forms the insulating layer on the upper heat dissipating plate 4. In the semiconductor device 1 shown in FIG. 8, the insulating member 10b is partially disposed on the top surface of the lower heat dissipating plate 3, and the base portion of the insulating member 10e is partially disposed on the underside of the upper heat dissipating plate 4. In the semiconductor device 1 shown in FIG. 9, the insulating member 10b is disposed over or substantially over the top surface of the lower heat dissipating plate 3, and the base portion of the insulating member 10e is disposed over or substantially over the underside of the upper heat dissipating plate 4.

Unlike the semiconductor device 1 shown in FIG. 7, the semiconductor devices 1 shown in FIGS. 8 and 9 eliminate the need for the concave portions formed on the heat dissipating plates 3 and 4, thereby achieving low cost. For example, the base portion of the insulating member 10e may have a larger area than the top surface of the semiconductor chip 2 such that heat is efficiently released mainly from the pressing portion 6a of the second electrode 6 to the upper heat dissipating plate 4. Since the base portion of the insulating member 10e disposed on the underside of the upper heat dissipating plate 4 has a larger area than the top surface of the semiconductor chip 2, the pressing portions 6a and 7a of the electrodes 6 and 7 and the upper heat dissipating plate 4 are reliably insulated from each other.

The lower heat dissipating plate 3 and the upper heat dissipating plate 4 in FIGS. 3 to 9 may be optionally combined with each other. For example, the semiconductor device 1 may include the lower heat dissipating plate 3 having the insulating layer 10a in FIG. 3 and the upper heat dissipating plate 4 having the insulating member 10e in FIG. 8.

As has been discussed, in the present embodiment, the pressing portions 5a to 7a of the electrodes 5 to 7 are pressed and joined into contact with the semiconductor chip 2. Thus, in the semiconductor device 1 of the present embodiment, the pressing portions 5a to 7a of the electrodes 5 to 7 can avoid a break on each part connected to the semiconductor chip 2. For example, if the semiconductor chip 2 is made of SiC, the semiconductor chip 2 has a thermal expansion coefficient of 3 to 4 ppm/° C. If the electrodes 5 to 7 electrically connected to the semiconductor chip 2 include substrates that are made of copper, the electrodes 5 to 7 have a thermal expansion coefficient of 17 ppm/° C. A stress is generated on the connecting interfaces between the pressing portions 5a to 7a of the electrodes 5 to 7 and the semiconductor chip 2 according to a temperature change of the semiconductor chip 2. In the semiconductor device 1, however, the pressing portions 5a to 7a of the electrodes 5 to 7 are in contact with the semiconductor chip 2 but are not fixed to the semiconductor chip 2. Thus, even if a stress is generated on the connecting interfaces between the pressing portions 5a to 7a of the electrodes 5 to 7 and the semiconductor chip 2 according to a temperature change of the semiconductor chip 2, the pressing portions 5a to 7a of the electrodes 5 to 7 slide relative to each other, the stress generated on the connecting interfaces is reduced. This can avoid a break on the parts connecting the pressing portions 5a to 7a of the electrodes 5 to 7 to the semiconductor chip 2, obtaining reliable connection between the semiconductor chip 2 and the electrodes 5 to 7.

Furthermore, a stress is also generated according to a difference in thermal expansion coefficient on the connecting interface between the pressing portion 5a of the first electrode 5 and the lower heat dissipating plate 3, the connecting interface between the pressing portion 6a of the second electrode 6 and the upper heat dissipating plate 4, and on the connecting interface between the pressing portion 7a of the third electrode 7 and the upper heat dissipating plate 4. In the semiconductor device 1, however, the pressing portions to 7a of the electrodes 5 to 7 are in contact with the heat dissipating plates 3 and 4 but are not fixed to the heat dissipating plates 3 and 4. This avoids a break on a part connecting the pressing portion 5a of the first electrode 5 to the lower heat dissipating plate 3. Similarly, a break is also avoided on a part connecting the pressing portion 6a of the second electrode 6 to the upper heat dissipating plate 4, and a break is also avoided on a part connecting the pressing portion 7a of the third electrode 7 to the upper heat dissipating plate 4. Thus, more reliable connection is obtained between the heat dissipating plates 3 and 4 and the electrodes 5 to 7.

In the semiconductor device 1, the pressing portions 5a to 7a of the electrodes 5 to 7 are in contact with the semiconductor chip 2 but are not fixed to the semiconductor chip 2 and the pressing portions 5a to 7a of the electrodes 5 to 7 are also in contact with the heat dissipating plates 3 and 4 but are not fixed to the heat dissipating plates 3 and 4. Thus, if the semiconductor chip 2 is found to be defective after the semiconductor device 1 is assembled, the semiconductor chip 2 can be easily repaired.

Referring to Tables 1 and 2, the materials of the heat dissipating plates 3 and 4 will be described below. The materials are selected so as to reduce a stress generated on the connecting interface between the pressing portion 5a of the first electrode 5 and the lower heat dissipating plate 3, the connecting interface between the pressing portion 6a of the second electrode 6 and the upper heat dissipating plate 4, and the connecting interface between the pressing portion 7a of the third electrode 7 and the upper heat dissipating plate 4.

Table 1 shows the thermal expansion coefficients (α) of SiC (silicon carbide), Al (aluminum), Cu (copper), and AlN (aluminum nitride). Case 1 in Table 2 shows a difference in thermal expansion coefficient (Δα1) between the semiconductor chip and the electrode and a difference in thermal expansion coefficient (Δα2) between the electrode and the heat dissipating plate if the semiconductor chip is made of SiC, the substrate of the electrode is made of Cu or Al, and the substrate of the heat dissipating plate is made of Cu or Al.

Case 2 in Table 2 shows a difference in thermal expansion coefficient ($\Delta\alpha 1$) between the semiconductor chip and the electrode and a difference in thermal expansion coefficient ($\Delta\alpha 2$) between the electrode and the heat dissipating plate if the semiconductor chip is made of SiC, the substrate of the electrode is made of Cu or Al, and the substrate of the heat dissipating plate is made of AlN.

TABLE 1

|  | Thermal expansion coefficient ($\alpha$) |
|---|---|
| SiC | 3-4 ppm/° C. |
| Al | 20 ppm/° C. |
| Cu | 17 ppm/° C. |
| AlN | 4 ppm/° C. |

TABLE 2

|  | Case 1 | | | Case 2 |
|---|---|---|---|---|
| Semiconductor | SiC | SiC | SiC | SiC |
| Electrode | Cu | Cu | Al | Cu or Al |
| Heat dissipating plate | Cu | Al | Al | AlN |
| Between semiconductor/electrode $\Delta\alpha 1$ | 13-14 ppm/° C. Medium | 13-14 ppm/° C. Medium | 16-17 ppm/° C. Medium | 13-17 ppm/° C. Medium |
| Between electrode/heat dissipating plate $\Delta\alpha 2$ | 0 ppm/° C. Small | 3 ppm/° C. Small | 0 ppm/° C. Small | 13-16 ppm/° C. Medium |
| Comprehensive evaluation | Excellent | Excellent | Excellent | Good |

As shown in Table 2, in Case 1, the difference in thermal expansion coefficient ($\Delta\alpha 1$) between the semiconductor chip and the electrode is 13 to 17 ppm/° C. and the difference in thermal expansion coefficient ($\Delta\alpha 2$) between the electrode and the heat dissipating plate is 0 to 3 ppm/° C. In Case 2, the difference in thermal expansion coefficient ($\Delta\alpha 1$) between the semiconductor chip and the electrode is 13 to 17 ppm/° C., which is equal to that of Case 1, and the difference in thermal expansion coefficient ($\Delta\alpha 2$) between the electrode and the heat dissipating plate is 13 to 16 ppm/° C., which is larger than that of Case 1. This is because the substrate of the electrode and the substrate of the heat dissipating plate are both metallic in Case 1 while the substrate of the electrode is metallic but the substrate of the heat dissipating plate is not metallic but inorganic in Case 2. Thus, a stress generated according to the difference $\Delta\alpha 2$ in thermal expansion coefficient between the electrode and the heat dissipating plate is smaller in Case 1 than in Case 2. For this reason, both of the substrate of the lower heat dissipating plate 3 and the substrate of the upper heat dissipating plate 4 are preferably metallic.

Figure 10A:
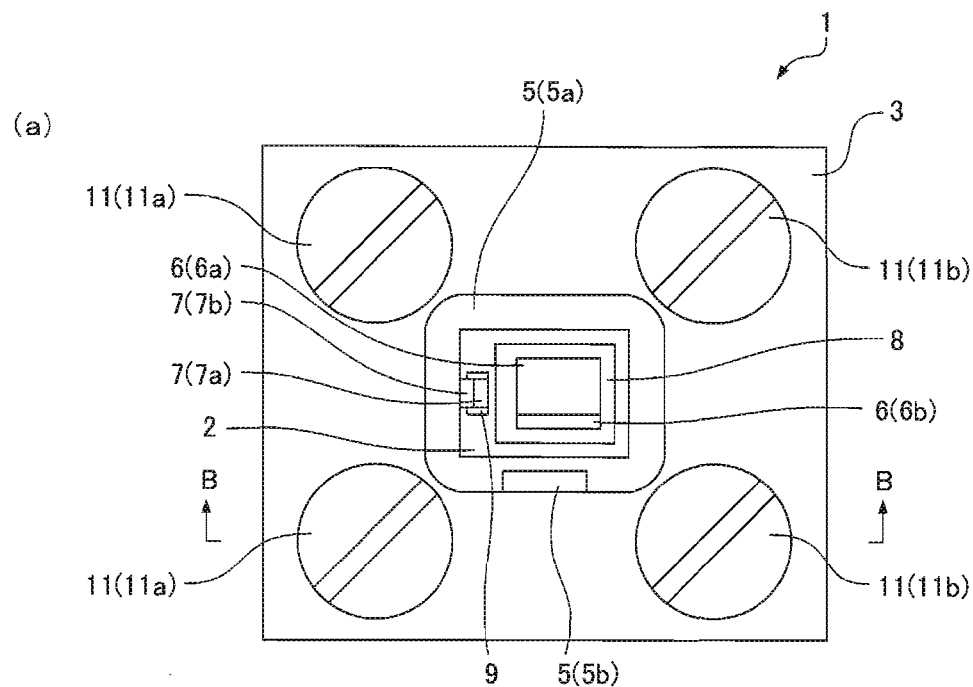
FIG. 10A is a plan view schematically showing a first structural example of a pressure generating mechanism provided in the semiconductor device according to the embodiment of the present invention.
Figure 10B:
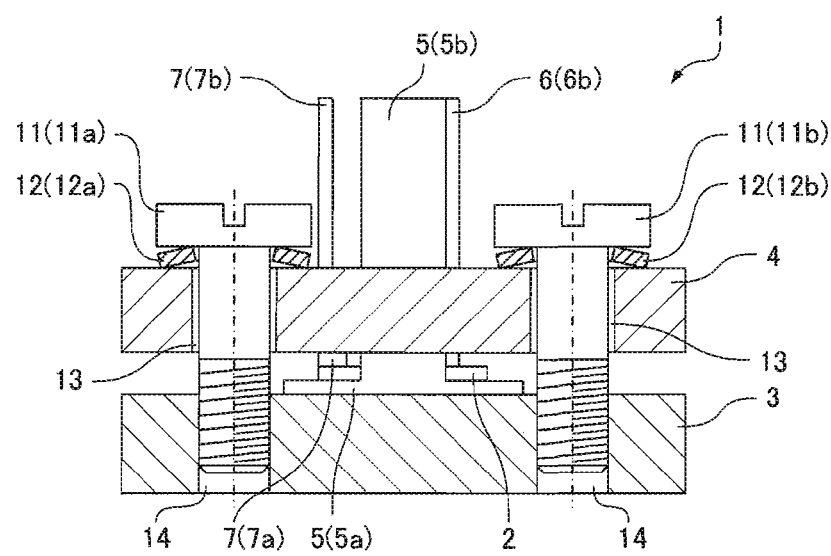
FIG. 10B is a cross-sectional view schematically showing the first structural example of the pressure generating mechanism provided in the semiconductor device according to the embodiment of the present invention.

Referring to FIGS. 10A and 10B, a first specific example of the pressure generating mechanism will be discussed below. The pressure generating mechanism generates a pressure that presses and joins the pressing portion 5a of the first electrode 5 to the lower heat dissipating plate 3 and the semiconductor chip 2 and presses and joins the pressing portion 6a of the second electrode 6 and the pressing portion 7a of the third electrode 7 to the upper heat dissipating plate 4 and the semiconductor chip 2, respectively. FIG. 10A is a plan view schematically showing a structural example of the pressure generating mechanism according to the present embodiment. FIG. 10B is a cross-sectional view taken along the line B-B of FIG. 10A. FIG. 10A does not show the upper heat dissipating plate 4.

In the semiconductor device 1 shown in FIGS. 10A and 10B, four screws 11 and four springs 12 are used as the pressure generating mechanism. The upper heat dissipating plate 4 has four holes 13 where the four screws 11 are inserted. The four holes 13 are preferably formed in point symmetry with respect to the center of the top surface of the semiconductor chip 2. On the lower heat dissipating plate 3, screw holes 14 are formed at four points aligned with the four screw holes 13 formed on the upper heat dissipating plate 4. The spring 12 is disposed between a collar on the upper end of the screw 11 and the upper heat dissipating plate 4. With this configuration, the four screws 11 are inserted so as to fix the lower heat dissipating plate 3 and the upper heat dissipating plate 4 and apply a pressure to the semiconductor chip 2. The spring 12 may be a coned disc spring, a waved washer, or the like.

A pressure is generated by the four screws 11 and the four springs 12 so as to press and join the pressing portion 5a of the first electrode 5 disposed between the lower heat dissipating plate 3 and the semiconductor chip 2 to the lower heat dissipating plate 3 and the semiconductor chip 2. Simultaneously, the pressing portion 6a of the second electrode 6 disposed between the upper heat dissipating plate 4 and the semiconductor chip 2 and the pressing portion 7a of the third electrode 7 are both pressed and joined to the upper heat dissipating plate 4 and the semiconductor chip 2, respectively. With this configuration, a pressure can be adjusted at four points, facilitating an adjustment of pressure distribution. Thus, the pressure generating mechanism shown in FIGS. 10A and 10B can create accurate pressure distribution.

Preferable pressure distribution will be discussed below. A larger pressure is preferably applied to larger one of the pressing portion 6a of the second electrode 6 in contact with the top surface of the semiconductor chip 2 and the pressing portion 7a of the third electrode 7. For example, in FIGS. 10A and 10B, the pressing portion 6a of the second electrode 6 on the right side has a larger area than the pressing portion 7a of the third electrode 7 on the left side. In this case, a screw 11b on the right side is tightened more than a screw 11a on the left side such that a pressure generated by a spring 12b on the right side is larger than a pressure generated by a spring 12a on the left side. Thus, a pressure for pressing and joining the relatively large pressing portion 6a of the second electrode 6 to the semiconductor chip 2 is larger than a pressure for pressing and joining the relatively small pressing portion 7a of third electrode 7 to the semiconductor chip 2. Thus, the pressing portion 6a of the second electrode 6 that receives a larger current than the third electrode 7 can be more stably pressed into contact with the semiconductor chip 2.

Figure 11A:
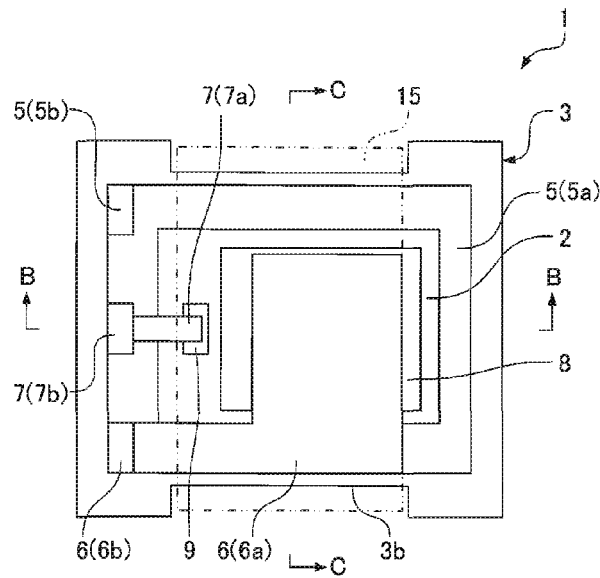
FIG. 11A is a plan view schematically showing a second structural example of the pressure generating mechanism provided in the semiconductor device according to the embodiment of the present invention.
Figure 11C:
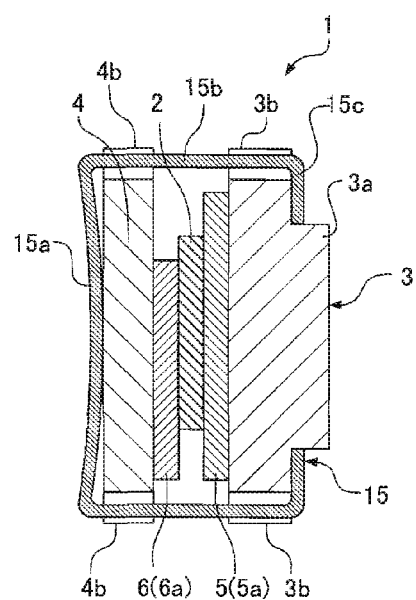
FIG. 11C is a cross-sectional view taken along a different direction so as to schematically show the second structural example of the pressure generating mechanism provided in the semiconductor device according to the embodiment of the present invention.
Figure 11B:
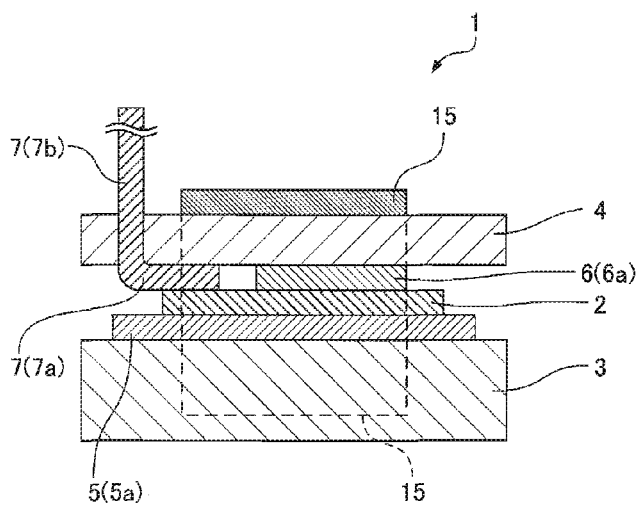
FIG. 11B is a cross-sectional view schematically showing the second structural example of the pressure generating mechanism provided in the semiconductor device according to the embodiment of the present invention.

Referring to FIGS. 11A to 11C, another example (second specific example) of the pressure generating mechanism will be described below. The pressure generating mechanism presses and joins the pressing portion 5a of the first electrode 5 to the lower heat dissipating plate 3, presses and joins the pressing portion 6a of the second electrode 6 and the pressing portion 7a of the third electrode 7 to the upper heat dissipating plate 4, and presses and joins the pressing portions 5a to 7a of the electrodes 5 to 7 to the semiconductor chip 2. FIG. 11A is a plan view schematically showing another structural example of the pressure generating mechanism according to the present embodiment. FIG. 11A does not illustrate the upper heat dissipating plate 4. FIG. 11A shows a clip 15 indicated by a virtual line (phantom line). FIG. 11B is a cross-sectional view taken along the line B-B of FIG. 11A. FIG. 11C is a cross-sectional view taken along the line C-C of FIG. 11A.

In the semiconductor device 1 shown in FIGS. 11A to 11C, the pressure generating mechanism is the single clip 15. The clip 15 has a central portion 15a, two sides 15b bent from two sides of the central portion 15a, and two holding portions 15c bent from the respective ends of the two sides 15b. The clip 15 includes a plate spring.

The clip 15 is attached to the semiconductor device 1 such that the central portion 15a is in contact with the top surface of the upper heat dissipating plate 4 and the two holding portions 15c are in contact with the underside of the lower heat dissipating plate 3. The single clip 15 is attached along one circumferential direction of the semiconductor device 1 so as to press and fix the lower heat dissipating plate 3 and the upper heat dissipating plate 4 with the biasing force (clamping force) of the plate spring forming the clip 15. The pressure presses and joins the pressing portion 5a of the first electrode 5 disposed between the lower heat dissipating plate 3 and the semiconductor chip 2 to the lower heat dissipating plate 3 and the semiconductor chip 2 and presses and joins the pressing portion 6a of the second electrode 6 disposed between the upper heat dissipating plate 4 and the semiconductor chip 2 and the pressing portion 7a of the third electrode 7 to the upper heat dissipating plate 4 and the semiconductor chip 2.

A step 3a provided on the underside of the lower heat dissipating plate 3 is projected with a flat surface such that the lower heat dissipating plate 3 in contact with another heat dissipating path is not interrupted by the clip 15. The step 3a allows the lower heat dissipating plate 3 to easily come into contact with another heat dissipating path, for example, a radiator fin or graphite. Furthermore, the step 3a of the lower heat dissipating plate 3 prevents the clamping force of the clip 15 from moving the ends of the holding portions 15c. The side walls of the lower heat dissipating plate 3 have concave portions 3b where the sides 15b of the clip 15 are inserted. The side walls of the upper heat dissipating plate 4 also have concave portions 4b where the sides 15b of the clip 15 are inserted, like the lower heat dissipating plate 3. As shown in FIG. 11A, the projecting portions 5b to 7b of the electrodes 5 to 7 are provided at predetermined positions outside the projection area of the clip 15.

In the configuration illustrated in FIGS. 11A to 11C, the pressing portions can be pressed and joined to the heat dissipating plates and the semiconductor chip with the single chip 15. Thus, this configuration allows the semiconductor device 1 to be assembled with ease.

The clip 15 may be attached to the semiconductor device 1 such that the central portion 15a is in contact with the underside of the lower heat dissipating plate 3 and the two holding portions 15c are in contact with the top surface of the upper heat dissipating plate 4. In this case, the step is provided on the top surface of the upper heat dissipating plate 4. The step is a projection having a flat surface that allows the upper heat dissipating plate 4 to easily come into contact with another heat dissipating path, for example, a radiator fin or graphite. Furthermore, the step prevents the clamping force of the clip 15 from moving the ends of the holding portions 15c.

Referring to FIGS. 12A to 12C, a semiconductor device with two clips acting as a pressure generating mechanism will be described below. FIG. 12A is a plan view schematically showing another structural example (third specific example) of the pressure generating mechanism according to the present embodiment. FIG. 12A does not illustrate the upper heat dissipating plate 4. FIG. 12B is a cross-sectional view taken along the line B-B of FIG. 12A. FIG. 12C is a cross-sectional view taken along the line C-C of FIG. 12A. FIG. 12B shows clips 16 indicated by a virtual line (phantom line).

In the semiconductor device 1 shown in FIGS. 12A to 12C, the two small clips 16 are used as the pressure generating mechanism instead of the clip 15 shown in FIGS. 11A to 11C. The clip 16 includes a central portion 16a and two holding portions 16b bent from two ends of the central portion 16a. The clip 16 includes a plate spring.

The paired clips 16 are attached to predetermined two ends of the semiconductor device 1. Specifically, the clip 16 is attached to the semiconductor device 1 such that the central portion 16a is opposed to a side wall of the lower heat dissipating plate 3 and a side wall of the upper heat dissipating plate 4, one of the holding portions 16b is in contact with the underside of the lower heat dissipating plate 3, and the other holding portion 16b is in contact with the top surface of the upper heat dissipating plate 4. The clips 16 are attached along one circumferential direction of the semiconductor device 1 so as to press and fix the lower heat dissipating plate 3 and the upper heat dissipating plate 4 with the biasing forces (clamping forces) of the plate springs forming the clips 16. The pressure presses and joins the pressing portion 5a of the first electrode 5 disposed between the lower heat dissipating plate 3 and the semiconductor chip 2 to the lower heat dissipating plate 3 and the semiconductor chip 2 and presses and joins the pressing portion 6a of the second electrode disposed between the upper heat dissipating plate 4 and the semiconductor chip 2 and the pressing portion 7a of the third electrode 7 to the upper heat dissipating plate 4 and the semiconductor chip 2.

The step 3a provided on the underside of the lower heat dissipating plate 3 is projected with a flat surface such that the lower heat dissipating plate 3 in contact with another heat dissipating path is not interrupted by the clips 16. The step 3a allows the lower heat dissipating plate 3 to easily come into contact with another heat dissipating path, for example, a radiator fin or graphite. Similarly, a step 4a provided on the top surface of the upper heat dissipating plate 4 is projected with a flat surface such that the upper heat dissipating plate 4 easily comes into contact with another heat dissipating path, for example, a radiator fin or graphite. Furthermore, the steps 3a and 4a prevent the clamping force of the clip 16 from moving the ends of the holding portions 16b.

As shown in FIG. 12A, the projecting portions 5b to 7b of the electrodes 5 to 7 are provided at predetermined positions outside the projection areas of the clips 16.

In the configuration shown in FIGS. 12A to 12C, the surfaces of the heat dissipating plates 3 and 4 are more widely opened than in the use of the single clip, thereby improving the heat dissipation of the semiconductor device 1. In this case, the surfaces of the heat dissipating plates 3 and 4 are opposite from the semiconductor chip 2 facing the other surfaces of the heat dissipating plates 3 and 4.

As shown in FIGS. 12A to 12C, the paired clips 16 are preferably disposed along one circumferential direction of the semiconductor device 1. The paired clips 16 may be disposed in different circumferential directions of the semiconductor device 1.

Figure 13:
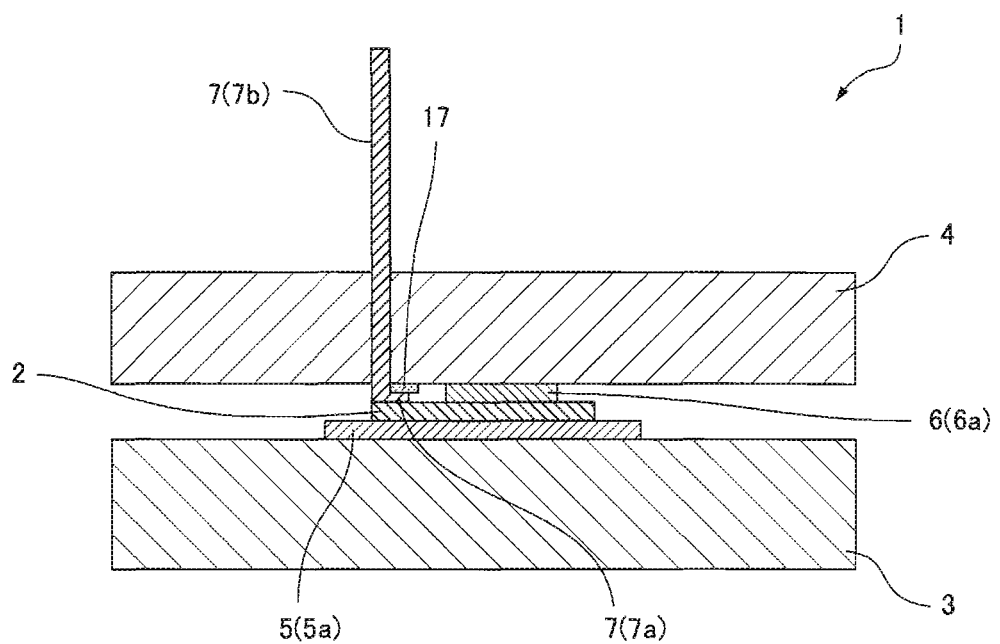
FIG. 13 is a cross-sectional view schematically showing a ninth structural example of the semiconductor device according to the embodiment of the present invention.

Referring to FIG. 13, a configuration for obtaining a semiconductor device with high heat dissipation and reliable electrical connection will be described below. Such a semiconductor device can be obtained even if the pressing portions of the electrodes connected to the respective surface electrodes formed on the one main surface of the semiconductor chip 2 are varied in thickness (height). FIG. 13 is a cross-sectional view schematically showing another structural example of the semiconductor device 1 according to the present embodiment.

In the semiconductor device 1, the source electrode 8 and the gate electrode 9 are formed on the top surface of the semiconductor chip 2. Thus, the two electrodes 6 and 7 respectively connected to the source electrode 8 and the gate electrode 9 are disposed on the top surface of the semiconductor chip 2. If the pressing portions 6a and 7a of the two electrodes 6 and 7 vary in thickness, thinner one of the pressing portions cannot satisfactorily come into contact with and join the semiconductor chip 2 and the upper heat dissipating plate 4.

In order to solve the problem, in the semiconductor device 1 in FIG. 13, the pressing portion 7a of the third electrode 7 has a smaller area than the pressing portion 6a of the second electrode 6 and has a smaller thickness than the pressing portion 6a. A cushioning material 17 is disposed between the thin pressing portion 7a of the third electrode 7 and the upper heat dissipating plate 4. Since the cushioning material 17 is disposed between the thin pressing portion 7a of the third electrode 7 and the upper heat dissipating plate 4, the pressing portion 6a of the second electrode 6 on the source electrode 8 and the pressing portion 7a of the third electrode 7 on the gate electrode 9 can be satisfactorily pressed and joined to the semiconductor chip 2 and the upper heat dissipating plate 4. For example, the cushioning material 17 may be a polyimide resin thin film having thermal resistance.

Of the pressing portions of the electrodes connected to the respective surface electrodes formed on one main surface of the semiconductor chip 2, the pressing portion having a smaller area preferably has a smaller thickness than the other pressing portion. With this configuration, the pressing portion having a larger area is in direct contact with the heat dissipating plate, achieving a semiconductor device having high heat dissipation.

Figure 14A:
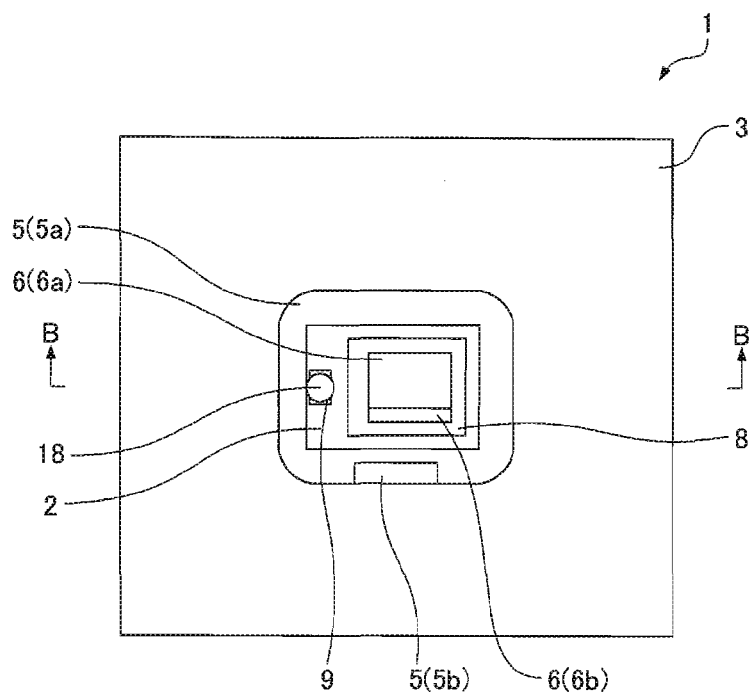
FIG. 14A is a plan view schematically showing a tenth structural example of the semiconductor device according to the embodiment of the present invention.
Figure 14B:
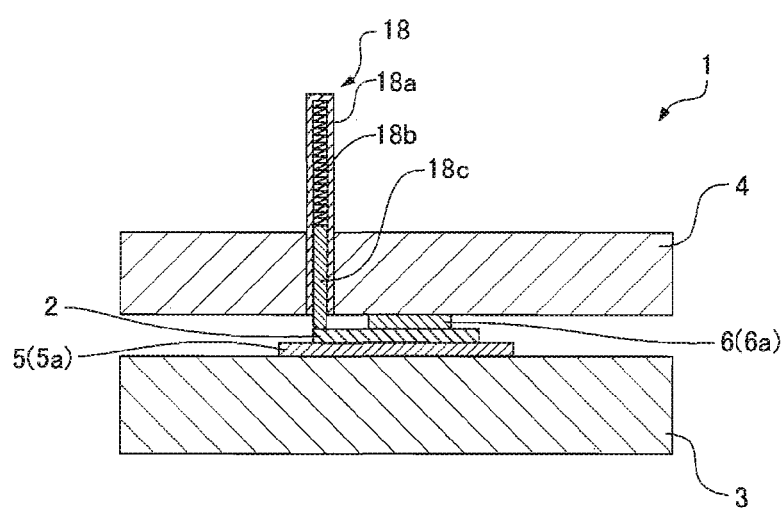
FIG. 14B is a cross-sectional view schematically showing the tenth structural example of the semiconductor device according to the embodiment of the present invention.

Referring to FIGS. 14A and 14B, another configuration in the following explanation obtains satisfactory contact between the semiconductor chip 2 and the electrodes connected to the respective surface electrodes formed on one main surface of the semiconductor chip 2. FIG. 14A is a plan view schematically showing another structural example of the semiconductor device 1 according to the present embodiment. FIG. 14B is a cross-sectional view taken along the line B-B of FIG. 14A, FIG. 14A does not illustrate the upper heat dissipating plate 4.

The semiconductor device 1 shown in FIGS. 14A and 14B includes a spring electrode 18 acting as a third electrode electrically connected to the gate electrode of the semiconductor chip 2. The spring electrode 18 includes a cylindrical portion (housing) 18a having a closed end, a spring 18b, and a contact portion 18c. In the spring electrode 18, one end of the spring 18b is disposed in the bottom of the cylindrical portion 18a, and the proximal end of the contact portion 18c is in contact with another end of the spring 18b. Moreover, the end of the contact portion 18c projects from the open end of the cylindrical portion 18a. The spring 18b may be, for example, a coiled spring. Of the components of the spring electrode 18, at least the cylindrical portion 18a and the contact portion 18c are made of metals having high electrical conductivity like the material of the third electrode 7.

The spring electrode 18 is fixed on the upper heat dissipating plate 4 such that the end of the contact portion 18c comes into contact with the gate electrode 9 of the semiconductor chip 2 when the upper heat dissipating plate 4 is placed at a predetermined position above the semiconductor chip 2. The cylindrical portion 18a partially projects from the top surface of the upper heat dissipating plate 4 like the projecting portion 7a of the third electrode 7 that extends to the outside of the semiconductor device 1.

In the configuration shown in FIGS. 14A and 14B, the end of the contact portion 18c of the spring electrode 18 is satisfactorily pressed and joined to the gate electrode 9 of the semiconductor chip 2 by the biasing force of the spring 18b when the pressing portion 6a of the second electrode 6 on the source electrode 8 of the semiconductor chip 2 is pressed and joined to the semiconductor chip 2 and the upper heat dissipating plate 4 by a pressure generated by the pressure generating mechanism.

Of the electrodes connected to the respective surface electrodes formed on one main surface of the semiconductor chip 2, the electrode including the pressing portion with a smaller area is preferably replaced with the spring electrode 18. Thus, of the pressing portions, the pressing portion having a larger area is in contact with the heat dissipating plate, achieving a semiconductor device having high thermal dissipation.

Figure 15:
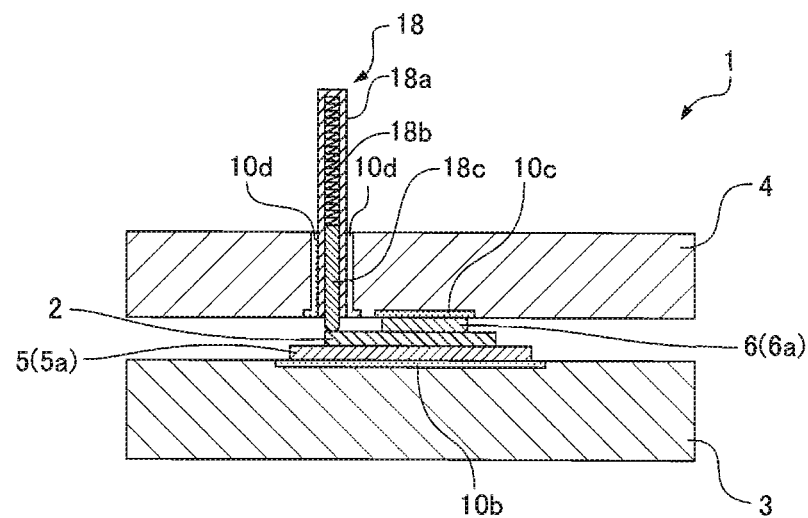
FIG. 15 is a cross-sectional view schematically showing an eleventh structural example of the semiconductor device according to the embodiment of the present invention.
Figure 16:
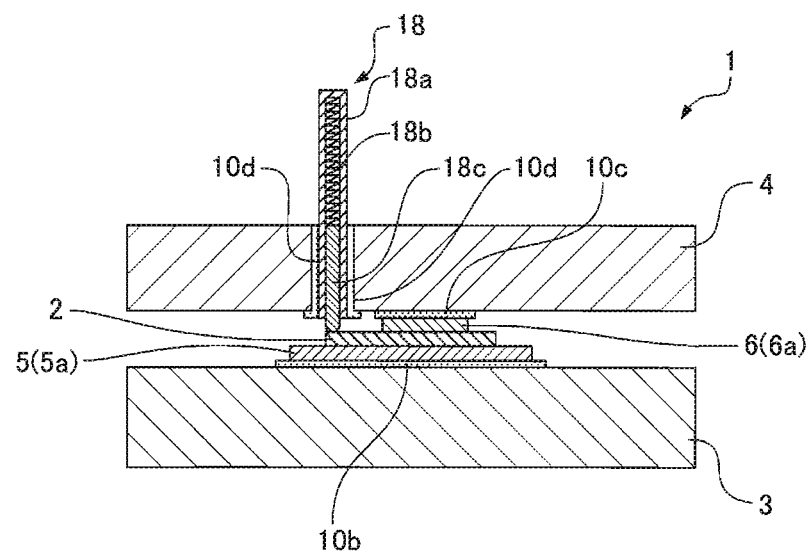
FIG. 16 is a cross-sectional view schematically showing a twelfth structural example of the semiconductor device according to the embodiment of the present invention.

In the semiconductor device 1 including the spring electrode 18, the heat dissipating plates 3 and 4 may have insulating layers as shown in FIGS. 3 to 9. For example, as shown in FIG. 15, the insulating member 10b may be embedded in the lower heat dissipating plate 3 and the insulating members 10c and 10d may be embedded in the upper heat dissipating plate 4 as in the semiconductor device 1 of FIG. 5. As shown in FIG. 16, the insulating member 10b may be disposed on the top surface of the lower heat dissipating plate 3 and the base portions of the insulating members 10c and 10d may be disposed on the top surface of the upper heat dissipating plate 4 as in the semiconductor device 1 of FIG. 6.

Figure 17A:
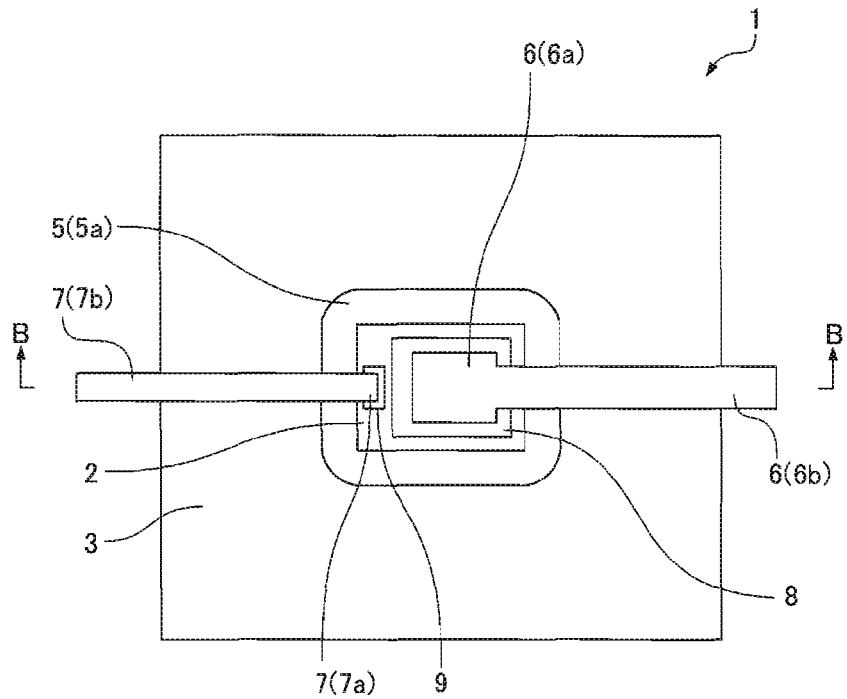
FIG. 17A is a plan view schematically showing a thirteenth structural example of the semiconductor device according to the embodiment of the present invention.
Figure 17B:
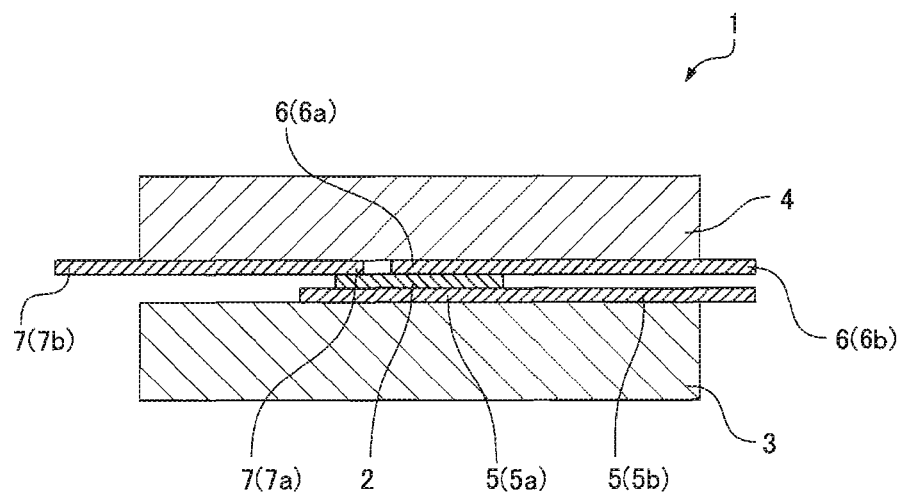
FIG. 17B is a cross-sectional view schematically showing the thirteenth structural example of the semiconductor device according to the embodiment of the present invention.

Referring to FIGS. 17A and 17B, another configuration for removing the electrodes electrically connected to the surface electrodes of the semiconductor chip 2, to the outside of the semiconductor device 1 will be described. FIG. 17A is a plan view schematically showing another structural example of the semiconductor device 1 according to the present embodiment. FIG. 17B is a cross-sectional view taken along the line B-B of FIG. 17A. FIG. 17A does not illustrate the upper heat dissipating plate 4.

In the semiconductor devices 1 shown in FIGS. 1A to 16, the electrodes 5 to 7 are removed out of the semiconductor device 1 in a direction crossing the upper heat dissipating plate 4. However, as shown in FIGS. 17A and 17B, the electrodes electrically connected to the surface electrodes of the semiconductor chip 2 may be removed out of the semiconductor device 1 in a horizontal direction relative to the semiconductor chip 2. With this configuration, the projecting portions 5b to 7b of the electrodes 5 to 7 project out of the semiconductor device 1 from a clearance between the lower heat dissipating plate 3 and the upper heat dissipating plate 4. This secures larger areas on the surfaces of the heat dissipating plates 3 and 4, achieving a semiconductor device with high thermal conductivity. In this case, the surfaces of the heat dissipating plates 3 and 4 are opposite from the semiconductor chip 2 facing the other surfaces of the heat dissipating plates 3 and 4.

The direction in which the projecting portions 5b to 7b of the electrodes 5 to 7 are removed is not particularly limited. The projecting portions 6b and 7b of the electrodes 6 and 7 disposed on the same main surface of the semiconductor chip 2 are preferably removed in a direction so as not to come into contact with each other.

In the semiconductor device 1 where the electrodes 5 to 7 are removed in the horizontal direction, insulating layers may be formed on the heat dissipating plates 3 and 4 as shown in FIGS. 3 to 9.

Figure 18:
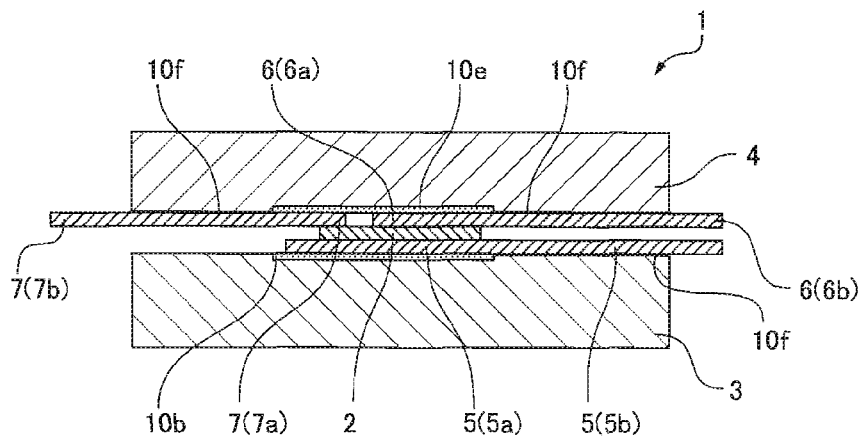
FIG. 18 is a cross-sectional view schematically showing a fourteenth structural example of the semiconductor device according to the embodiment of the present invention.

For example, as shown in FIG. 18, the insulating member 10b may be embedded into the lower heat dissipating plate 3 and the insulating member 10e may be embedded into the upper heat dissipating plate 4 as in the semiconductor device 1 of FIG. 7. However, the projecting portions 5b to 7b of the electrodes 5 to 7 do not intersect the upper heat dissipating plate 4 and thus the upper heat dissipating plate 4 does not need to contain the embedded insulating member for providing insulation between the projecting portions 5b to 7b of the electrodes 5 to 7 and the upper heat dissipating plate 4. Thus, the insulating member 10e embedded in the upper heat dissipating plate 4 in the semiconductor device 1 in FIG. 18 is shaped like the base portion of the insulating member 10e of FIG. 7. As shown in FIG. 18, the semiconductor device 1 requires an insulating element (insulating layer) 10f that provides insulation between the pressing portions 5b to 7b of the horizontally extended electrodes 5 to 7 and the heat dissipating plates 3 and 4, in addition to the insulating members 10b and 10e that provide insulation between the pressing portions 5a to 7a of the electrodes 5 to 7 and the heat dissipating plates 3 and 4. Specifically, the insulating element 10f provides insulation between the horizontally extended electrodes 5 to 7 and the heat dissipating plates 3 and 4 outside the peripheral area of the semiconductor chip 2. The material of the insulating element 10f may be made of an inexpensive insulating inorganic material. Specifically, the material of the insulating element 10f may be composed of a mica sheet.

Figure 19:
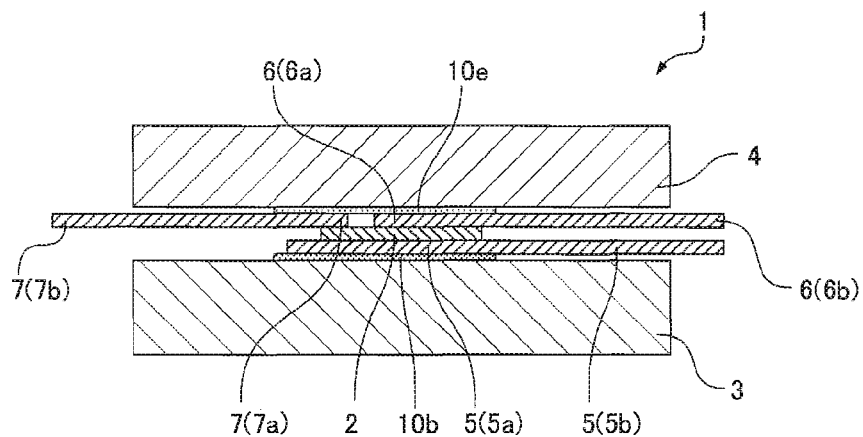
FIG. 19 is a cross-sectional view schematically showing a fifteenth structural example of the semiconductor device according to the embodiment of the present invention.
Figure 20:
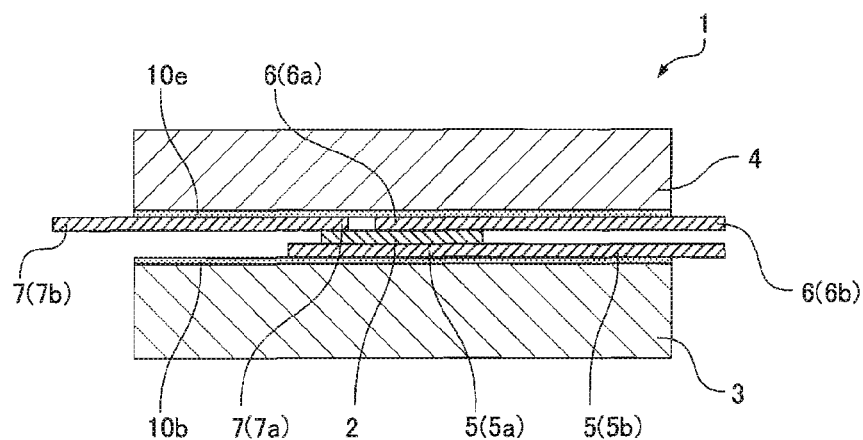
FIG. 20 is a cross-sectional view schematically showing a sixteenth structural example of the semiconductor device according to the embodiment of the present invention.

For example, as shown in FIGS. 19 and 20, the insulating member 10b may be disposed on the top surface of the lower heat dissipating plate 3 and the insulating member 10e may be disposed on the underside of the upper heat dissipating plate 4 as in the semiconductor devices 1 in FIGS. 8 and 9. In the semiconductor device 1 shown in FIGS. 19 and 20, the upper heat dissipating plate 4 does not need to contain an embedded insulating member for providing insulation between the projecting portions 5b to 7b of the electrodes 5 to 7 and the upper heat dissipating plate 4 as in the semiconductor device 1 shown in FIG. 18. The insulating member 10e on the underside of the upper heat dissipating plate 4 is shaped like the base portion of the insulating member 10e shown in FIG. 7. In the semiconductor devices 1 shown in FIGS. 19 and 20, an insulating element (insulating layer) may be provided between the projecting portions 15b to 7b of the horizontally extended electrodes 5 to 7 and the heat dissipating plates 3 and 4 as in the semiconductor device 1 shown in FIG. 18.

Figure 21:
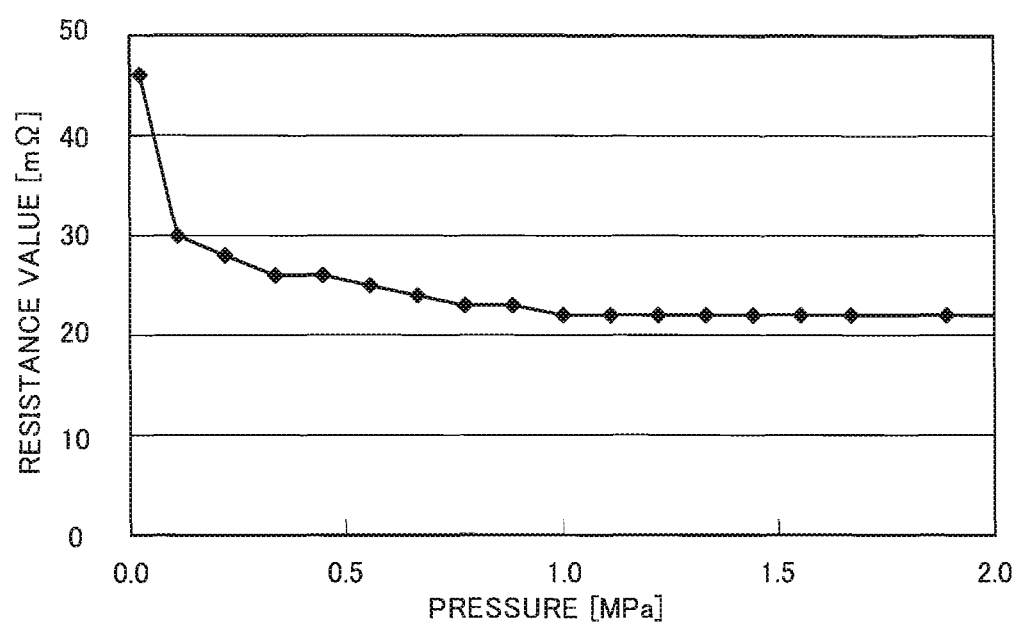
FIG. 21 is a graph showing the relationship between a pressure and a connection resistance value in the semiconductor device according to the embodiment of the present invention.

Referring to FIG. 21, a pressure applied to the semiconductor chip 2 will be described below. The vertical axis of a graph in FIG. 21 indicates the sum of the connection resistance value of the first surface electrode formed on the underside of the semiconductor chip 2 and the first electrode 5 in contact with the first surface electrode, the connection resistance value of the second surface electrode formed on the top surface of the semiconductor chip and the second electrode 6 in contact with the second surface electrode, and the resistance value of the semiconductor chip 2. The horizontal axis of the graph indicates a pressure (load) for pressing and joining the pressing portion 6a of the second electrode 6 with a relatively large area to the top surface of the semiconductor chip 2.

As shown in FIG. 21, a stable connection resistance value is obtained at a pressure of 0.5 MPa or higher. If the pressure increases to 30 MPa or higher, the semiconductor chip 2 may be broken. Thus, a pressure (load) of at least 0.5 MPa and less than 30 MPa is preferably applied to press and join the pressing portion 6a of the second electrode 6 to the top surface of the semiconductor chip 2. The second electrode 6 is disposed on a surface electrode fed with a large current, for example, a source electrode, an emitter electrode, or an anode electrode. The second electrode 6 is kept in contact with the surface electrode.

Figure 22A:
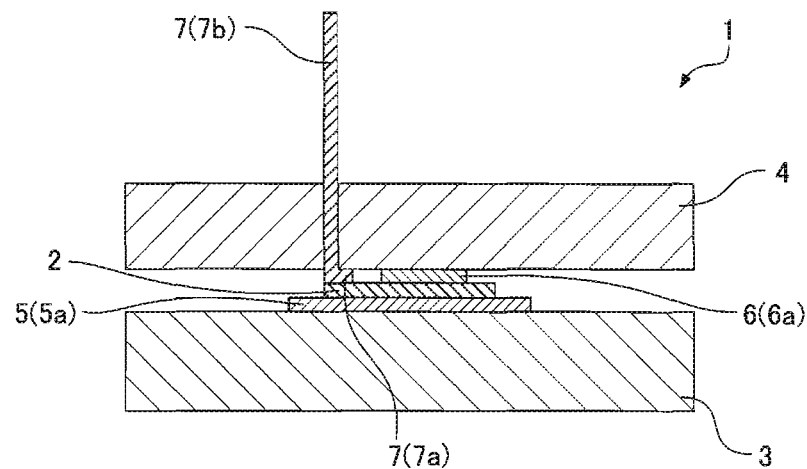
FIG. 22A is a cross-sectional view schematically showing a structural example of the semiconductor device according to the embodiment of the present invention, that is, a structural example in which an electrode disposed on the underside of a semiconductor chip has a larger area than the underside of the semiconductor chip.
Figure 22B:
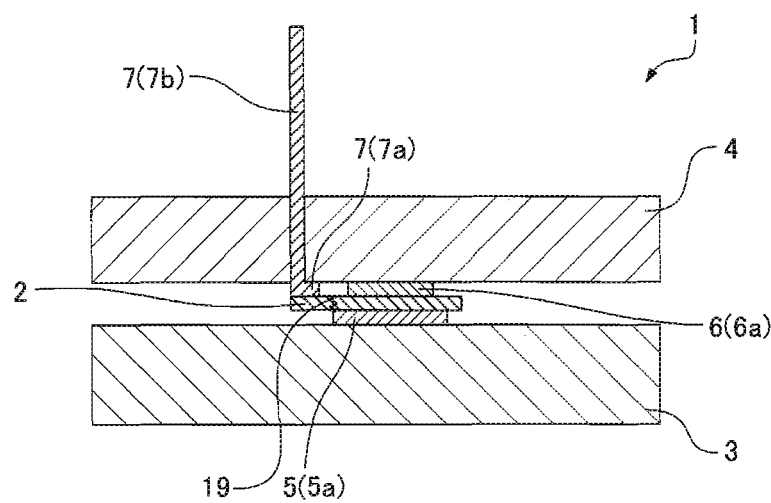
FIG. 22B is a cross-sectional view schematically showing a structural example of the semiconductor device in which the electrode disposed on the underside of the semiconductor chip has a smaller area than the underside of the semiconductor chip, as a comparative example of the structure of FIG. 22A.

Referring to FIGS. 22A and 22S, the area of the pressing portion 5a of the first electrode 5 will be discussed below. The first electrode 5 is in contact with the first surface electrode (not shown) formed on the underside of the semiconductor chip 2. FIG. 22A is a cross-sectional view schematically showing a structural example of the semiconductor device 1 in which the pressing portion 5a of the first electrode 5 has a suitable area. FIG. 22A schematically shows a structural example in which the pressing portion 5a of the first electrode 5 disposed on the underside of the semiconductor chip 2 has a larger area than the underside of the semiconductor chip 2. FIG. 22B is a cross-sectional view schematically showing a structural example of the semiconductor device 1 in which the pressing portion 5a of the first electrode 5 has a smaller area than the underside of the semiconductor chip 1, as a comparative example of the structure of FIG. 22A. In FIG. 22B, a defect appears in the semiconductor device 1.

As shown in FIG. 22A, if the pressing portion 5a of the first electrode 5 has a larger area than the underside of the semiconductor chip 2 so as to project from the outer periphery of the underside of the semiconductor chip 2, even a pressure applied to the top surface of the semiconductor chip 2 from the pressing portions 6a and 7a of the electrodes 6 and 7 is stably received by the pressing portion 5a of the first electrode 5.

In contrast, as shown in FIG. 22B, if the pressing portion 5a of the first electrode 5 has a smaller area than the underside of the semiconductor chip 2 such that the underside of the semiconductor chip 2 projects from the pressing portion 5a of the first electrode 5, the semiconductor chip 2 may be broken by a pressure applied to the semiconductor chip 2 from the pressing portions 6a and 7a of the electrodes 6 and 7 disposed on the top surface of the semiconductor chip 2. If the pressing portions 6a and 7a of the electrodes 6 and 7 vary in thickness, in particular, the semiconductor chip 2 is more likely to be broken. For example, as shown in FIG. 22B, a crack 19 may occur on the semiconductor chip 2 and the semiconductor chip 2 may be broken from the crack 19. The semiconductor chip 2 is likely to be destroyed particularly if the pressing portion 7a of the third electrode 7 has a larger thickness than the pressing portion 6a of the second electrode 6.

Heat generated from the semiconductor chip 2 is released through the pressing portion 5a of the first electrode 5. Thus, if the pressing portion 5a of the first electrode 5 has a larger area than the underside of the semiconductor chip 2 and the underside of the semiconductor chip 2 is contained in the area of the first electrode 5, this structure can satisfactorily increase the thermal dissipation of the semiconductor device 1.

Figure 23:
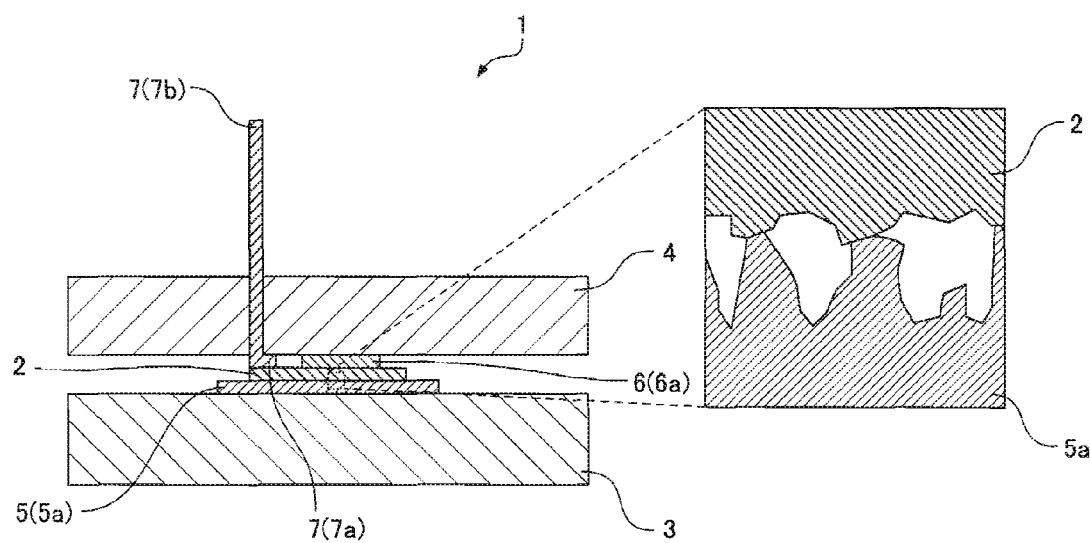
FIG. 23 is an enlarged cross-sectional view showing a part of the semiconductor device according to the embodiment of the present invention.

Referring to FIG. 23, the surface roughness of the semiconductor chip 2 and the pressing portions 5a to 7a of the electrodes 5 to 7 in contact with the semiconductor chip 2 will be described below. FIG. 23 is an enlarged view of the interface between the underside of the semiconductor chip 2 and the pressing portion 5a of the first electrode 5 in contact with the underside of the semiconductor chip 2. Specifically, FIG. 23 shows the interface between the first surface electrode formed on the first main surface (underside) of the semiconductor chip 2 and the pressing portion 5a of the first electrode 5.

As shown in FIG. 23, the contact portion of the first electrode 5 on the semiconductor chip 2 preferably has higher surface roughness than the contact portion of the semiconductor chip 2 on the first electrode 5. In other words, the top surface of the pressing portion 5a of the first electrode 5 preferably has higher surface roughness than the surface of the first surface electrode formed on the underside of the semiconductor chip 2. If the pressing portion 5a of the first electrode 5, which has lower hardness than the first surface electrode formed on the underside of the semiconductor chip 2, has higher surface roughness than the first surface electrode formed on the underside of the semiconductor chip 2, sliding caused by a difference in thermal expansion coefficient between the semiconductor chip 2 and the first electrode 5 deforms the contact portion of the first electrode 5 on the semiconductor chip 2 (first surface electrode), increasing adhesion between the pressing portion 5a of the first electrode 5 and the semiconductor chip 2 (first surface electrode).

Hence, the contact portion of the first electrode 5 on the semiconductor chip 2 has higher surface roughness than the contact portion of the semiconductor chip 2 on the first electrode 5. This obtains satisfactory connection between the semiconductor chip 2 and the first electrode 5.

Figure 24A:
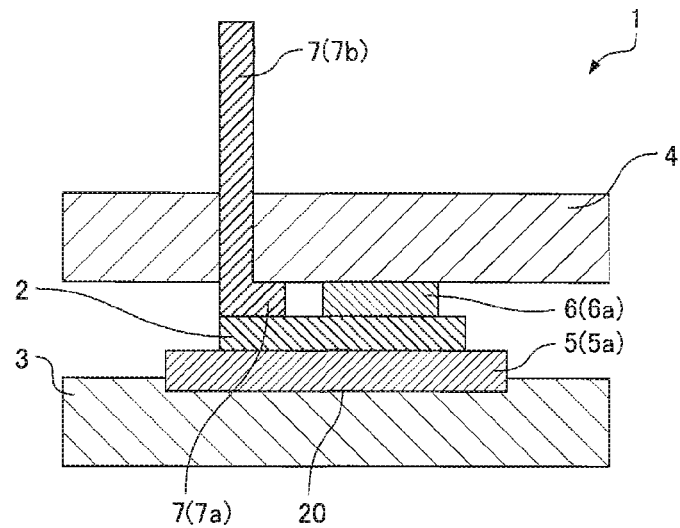
FIG. 24A is a cross-sectional view schematically showing a seventeenth structural example of the semiconductor device according to the embodiment of the present invention.

Referring to FIG. 24A, another structural example of the semiconductor device according to the present embodiment will be described below. FIG. 24A is a cross-sectional view schematically showing another structural example of the semiconductor device 1 according to the present embodiment.

As shown in FIG. 24A, in the semiconductor device 1, a concave portion 20 may be formed on the top surface of the lower heat dissipating plate 3 opposed to the first main surface (underside) of the semiconductor chip 2 such that the pressing portion 5a of the first electrode 5 disposed between the lower heat dissipating plate 3 and the semiconductor chip 2 is partially stored in the concave portion 20. The concave portion 20 can be formed by, for example, spot facing.

In the manufacturing process of the semiconductor device 1 according to the present embodiment, the first electrode 5 is disposed on the top surface of the lower heat dissipating plate 3. In this process, the pressing portion 5a of the first electrode 5 is partially stored in the concave portion 20 formed on the top surface of the lower heat dissipating plate 3 such that the first electrode 5 is held in the concave portion 20 of the lower heat dissipating plate 3. Thus, the first electrode 5 is not displaced after being disposed on the lower heat dissipating plate 3. This can stably manufacture the semiconductor device 1.

When the pressing portion 5a of the first electrode 5 is stored in the concave portion 20 of the lower heat dissipating plate 3, the lower part of the pressing Portion 5a of the first electrode 5 is not always stored in the concave portion 20 of the lower heat dissipating plate 3 unlike in FIG. 24A. For example, a projecting portion or a step may be formed on the underside of the pressing portion 5a of the first electrode 5, and a concave portion may be formed on the lower heat dissipating plate 3 so as to only store the projecting portion or the step provided on the underside of the pressing portion 5a of the first electrode 5. Alternatively, for example, a concave portion may be formed on the lower heat dissipating plate 3 so as to entirely store the pressing portion 5a of the first electrode 5.

In the semiconductor device 1 where the pressing portion 5a of the first electrode 5 is stored in the concave portion 20 of the lower heat dissipating plate 3, insulating layers may be formed on the heat dissipating plates 3 and 4 as shown in FIGS. 3 to 9.

Figure 25A:
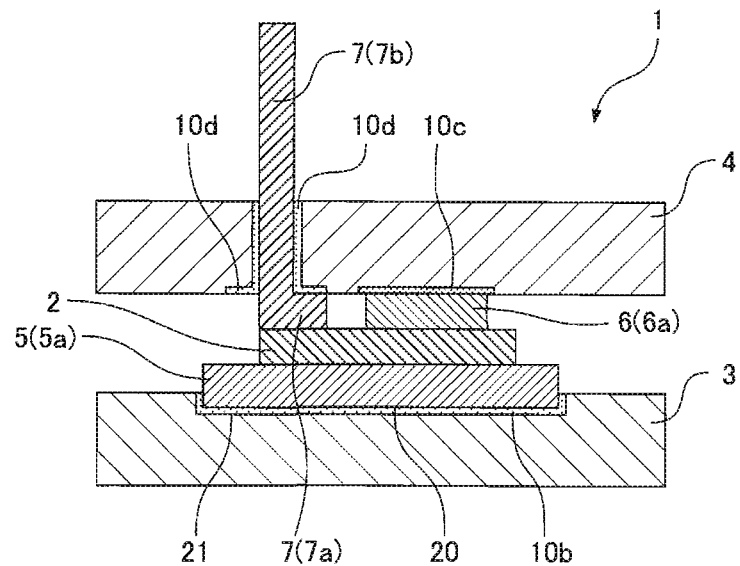
FIG. 25A is a cross-sectional view schematically showing a nineteenth structural example of the semiconductor device according to the embodiment of the present invention.

For example, as shown in FIG. 25A, the insulating member 10b may be embedded into the lower heat dissipating plate 3 while the insulating member 10c and the insulating member 10d may be embedded into the upper heat dissipating plate 4 as in the semiconductor device 1 of FIG. 5. In the semiconductor device 1 shown in FIG. 25A, the insulating member (insulating layer) 10b is shaped like the first concave portion 20 where the pressing portion 5a of the first electrode 5 is partially stored, and the insulating member 10b is disposed in a second concave portion 21 formed on the lower heat dissipating plate 3. This forms the first concave portion 20 on the top surface of the lower heat dissipating plate 3 where a part of the pressing portion 5a of the first electrode 5 is stored. The insulating member 10b shaped like the first concave portion 20 can be formed by machining, e.g., cutting or grinding. If the insulating member 10b is ceramic, the insulating member 10b shaped like the first concave portion 20 can be formed by molding instead of machining.

Figure 26A:
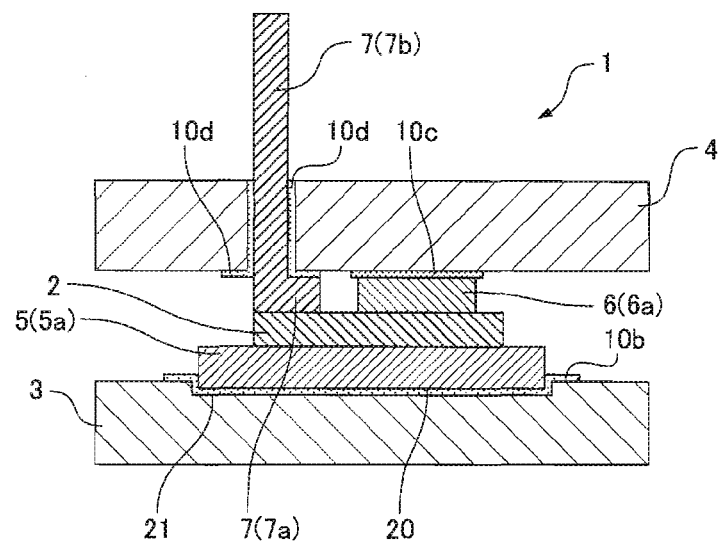
FIG. 26A is a cross-sectional view schematically showing a twenty-first structural example of the semiconductor device according to the embodiment of the present invention.

For example, as shown in FIG. 26A, the insulating member 10b may be disposed on the top surface of the lower heat dissipating plate 3 while the base portion of the insulating member 10c and the base portion of the insulating member 10d may be disposed on the underside of the upper heat dissipating plate 4 as in the semiconductor device 1 of FIG. 6. In the semiconductor device 1 shown in FIG. 26A, the insulating member (insulating layer) 10b is shaped like the first concave portion 21 such that a part of the pressing portion 5a of the first electrode 5 is stored, and the first concave portion 20 is disposed so as to be stored in the second concave portion 21 on the surface of the lower heat dissipating plate 3 where the second concave portion 21 is formed. Thus, the first concave portion 20 is formed on the top surface of the lower heat dissipating plate 3 where a part of the pressing portion 5a of the first electrode 5 is stored. The insulating member 10b shaped like the first concave portion 20 can be formed by machining, e.g., cutting or grinding. If the insulating member 10b is ceramic, the insulating member 10b shaped like the first concave portion 20 can be formed by molding instead of machining.

Figure 24B:
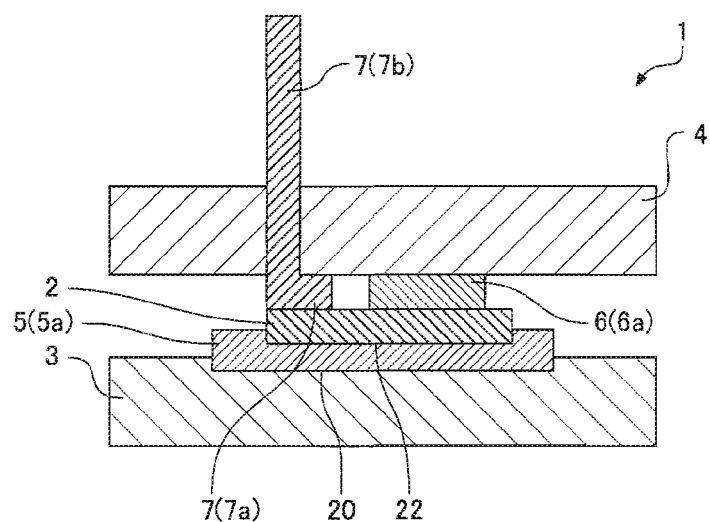
FIG. 24B is a cross-sectional view schematically showing an eighteenth structural example of the semiconductor device according to the embodiment of the present invention.

As shown in FIG. 24B, a concave portion 22 where a part of the semiconductor chip 2 is stored may be formed on the top surface of the pressing portion 5a of the first electrode 5 opposed to the underside of the semiconductor chip 2. The concave portion 22 of the first electrode 5 can be formed by, for example, spot facing like the concave portion 20 of the lower heat dissipating plate 3.

In the manufacturing process of the semiconductor device 1 according to the present embodiment, the semiconductor chip 2 is disposed on the top surface of the pressing portion 5a of the first electrode 5. In this process, the semiconductor chip 2 is partially stored in the concave portion 22 formed on the top surface of the pressing portion 5a of the first electrode 5 such that the semiconductor chip 2 is held in the concave portion 22 of the first electrode 5. Thus, the semiconductor chip 2 is not displaced after being disposed on the first electrode 5. This can stably manufacture the semiconductor device.

When the semiconductor chip 2 is partially stored in the concave portion 22 on the pressing portion 5a of the first electrode 5, the lower part of the semiconductor chip 2 is not always stored in the concave portion 22 on the pressing portion 5a of the first electrode 5 unlike in FIG. 24B. For example, a projecting portion or a step may be formed on the underside of the semiconductor chip 2, and a concave portion may be formed on the top surface of the pressing portion 5a of the first electrode 5 so as to only store the projecting portion or the step provided on the underside of the semiconductor chip 2.

Figure 25B:
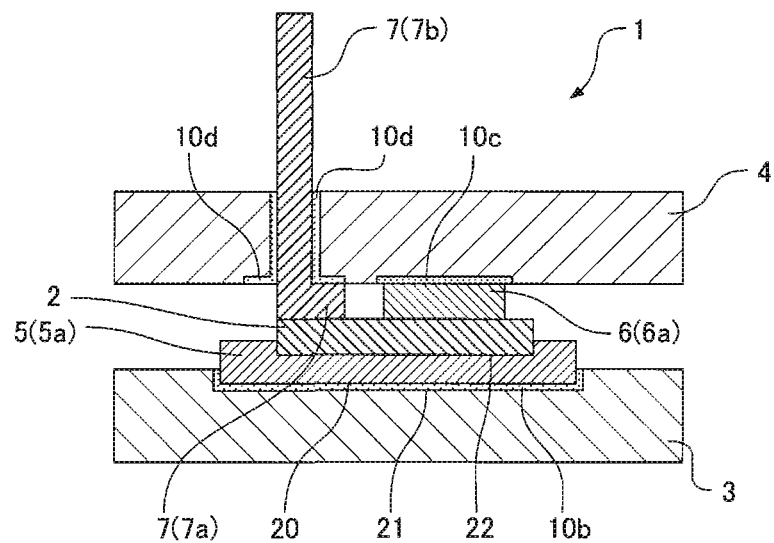
FIG. 25B is a cross-sectional view schematically showing a twelfth structural example of the semiconductor device according to the embodiment of the present invention.
Figure 26B:
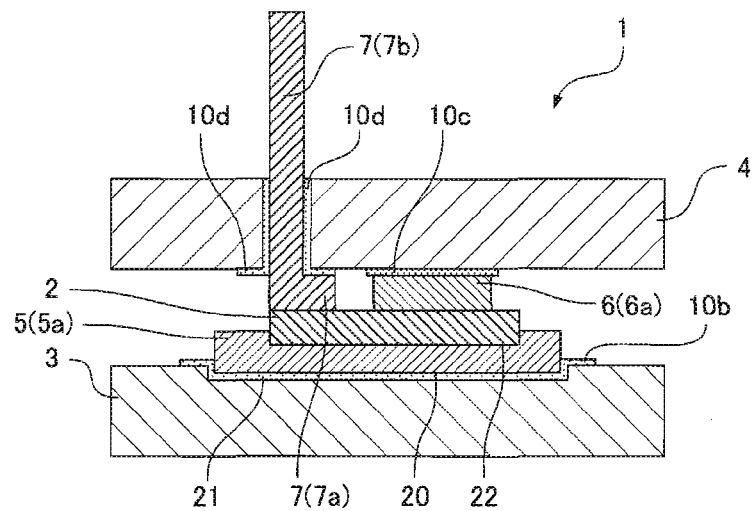
FIG. 26B is a cross-sectional view schematically showing a twenty-second structural example of the semiconductor device according to the embodiment of the present invention.

In the semiconductor device 1 where the semiconductor chip 2 is partially stored in the concave portion 22 on the pressing portion 5a of the first electrode 5, insulating layers may be formed on the heat dissipating plates 3 and 4 as shown in FIGS. 3 to 9. For example, as shown in FIG. 25B, the insulating member 10b may be embedded into the lower heat dissipating plate 3 while the insulating member 10c and the insulating member 10d may be embedded into the upper heat dissipating plate 4 as in the semiconductor device 1 of FIG. 25A. As shown in FIG. 26B, the insulating member 10b may be disposed on the top surface of the lower heat dissipating plate while the base portion of the insulating member 10c and the base portion of the insulating member 10d may be disposed on the underside of the upper heat dissipating plate 4 as in the semiconductor device 1 of FIG. 26A.

Furthermore, an insulating resin material may be applied around the semiconductor chip 2 in order to increase insulation and moisture resistance reliability. The resin material may be a silicone resin or a polyimide resin. A polyimide resin having heat resistance is a preferable resin material serving as a coating around the semiconductor chip 2. The insulting resin material can prevent electrical conduction between the surface electrodes of the semiconductor chip 2 and among the electrodes 5 to 7 in contact with the respective the surface electrodes of the semiconductor chip 2.

Generally, an insulating material has low thermal conductivity and thus an insulating resin material is not applied between the electrodes 5 to 7 and the heat dissipating plates 3 and 4 that serve as main heat dissipating paths. Since an insulating resin material is not applied to a main heat dissipating path, a resin material applied around the semiconductor chip 2 can be selected regardless of thermal conduction. Consequently, a resin material having higher thermal resistance can be selected. The resin material applied around the semiconductor chip 2 does not need the function of fixing the electrodes 5 to 7 to the semiconductor chip 2 or fixing the electrodes 5 to 7 to the heat dissipating plates 3 and 4. Thus, a resin material applied around the semiconductor chip 2 may be a resin applied to be gel or a resin applied to be a thin film having a thickness of 1 µm to 100 µm.

Figure 27:
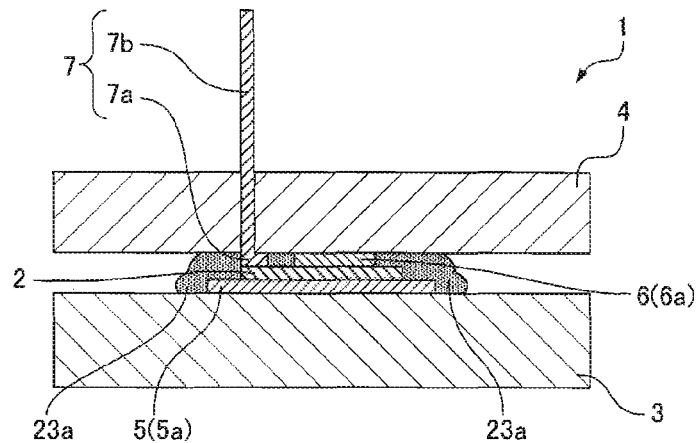
FIG. 27 is a cross-sectional view schematically showing a twenty-third structural example of the semiconductor device according to the embodiment of the present invention.
Figure 28:
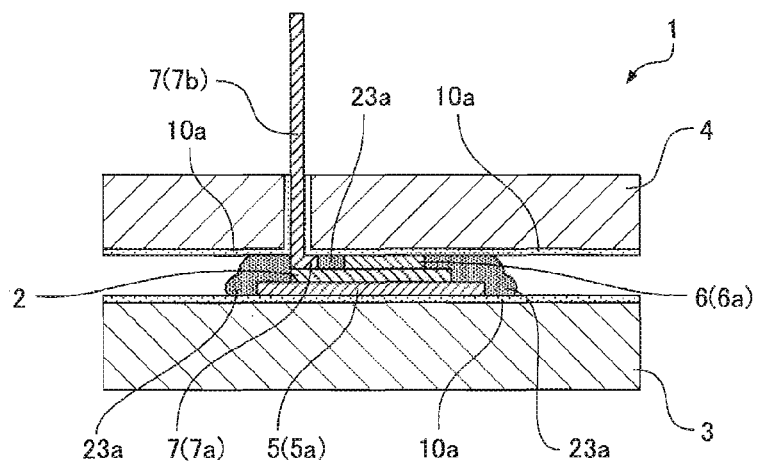
FIG. 28 is a cross-sectional view schematically showing a twenty-fourth structural example of the semiconductor device according to the embodiment of the present invention.
Figure 29:
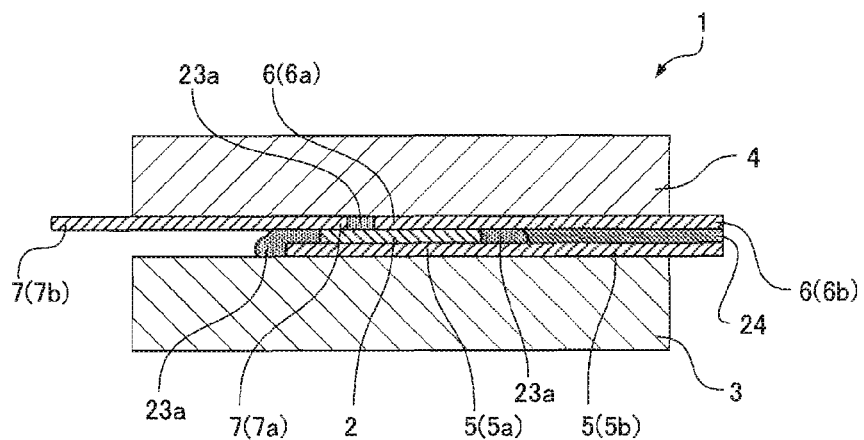
FIG. 29 is a cross-sectional view schematically showing a twenty-fifth structural example of the semiconductor device according to the embodiment of the present invention.
Figure 30:
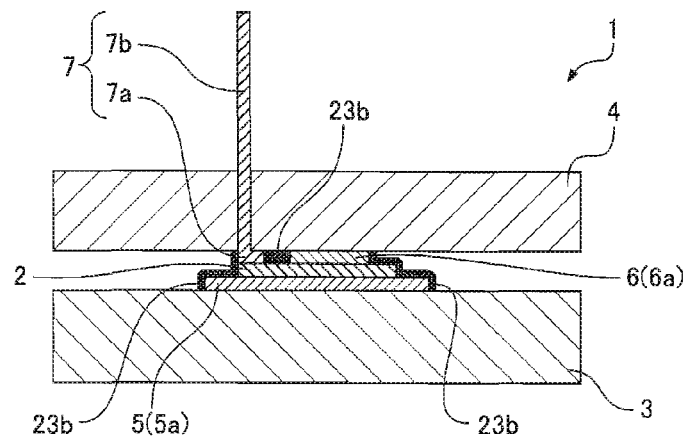
FIG. 30 is a cross-sectional view schematically showing a twenty-sixth structural example of the semiconductor device according to the embodiment of the present invention.
Figure 31:
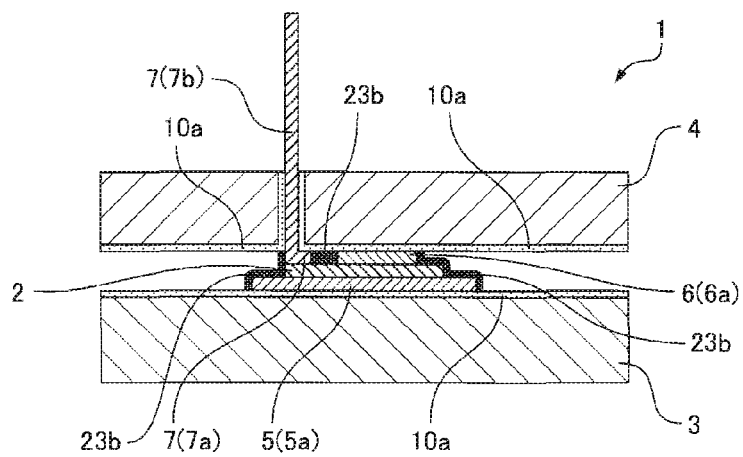
FIG. 31 is a cross-sectional view schematically showing a twenty-seventh structural example of the semiconductor device according to the embodiment of the present invention.
Figure 32:
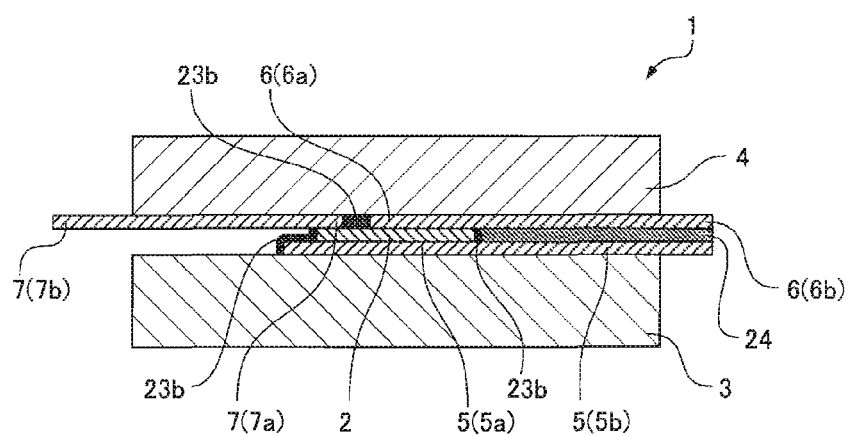
FIG. 32 is a cross-sectional view schematically showing a twenty-eighth structural example of the semiconductor device according to the embodiment of the present invention.

FIGS. 27 to 29 show structural examples of the semiconductor device 1 containing an insulating resin 23a applied to be gel. FIGS. 30 to 32 show structural examples of the semiconductor device 1 containing an insulating resin 23b applied to be a thin film. As shown in FIGS. 27 to 32, the insulating resins 23a and 23b are applied to points other than main heat dissipating paths from the electrodes 5 to 7 to the heat dissipating plates 3 and 4.

If the insulating resin 23a applied to be gel or the insulating resin 23b applied to be a thin film is selected, the applied resin does not interfere with a relative slide between the pressing portions 5a to 7a of the electrodes 5 to 7 and the semiconductor chip 2, a relative slide between the pressing portion 5a of the first electrode 5 and the lower heat dissipating plate 3, a relative slide between the pressing portion 6a of the second electrode 6 and the upper heat dissipating plate 4, and a relative slide between the pressing portion 7a of the third electrode 7 and the upper heat dissipating plate 4, unlike a resin applied to be cured into a solid. This can reduce a stress generated on each of the connection interfaces between the pressing portions 5a to 7a of the electrodes 5 to 7 and the semiconductor chip 2, a stress generated on the connection interface between the pressing portion 5a of the first electrode 5 and the lower heat dissipating plate 3, a stress generated on the connection interface between the pressing portion 6a of the second electrode 6 and the upper heat dissipating plate 4, and a stress generated on the connection interface between the pressing portion 7a of the third electrode 7 and the upper heat dissipating plate 4.

In the semiconductor device 1 according to the present embodiment, a resin material applied around the semiconductor chip 2 does not need the function of fixing the electrodes 5 to 7 to the semiconductor chip 2 or fixing the electrodes 5 to 7 to the heat dissipating plates 3 and 4. This increases the number of alternative resin materials to be applied around the semiconductor chip 2, allowing a choice of a resin material having higher heat resistance.

Moreover, in the semiconductor device 1 according to the present embodiment, a resin material applied around the semiconductor chip 2 does not need the function of fixing the electrodes 5 to 7 to the semiconductor chip 2 or fixing the electrodes 5 to 7 to the heat dissipating plates 3 and 4. Thus, the strength of a resin material to be applied around the semiconductor chip 2 does not need to be kept after being applied. Thus, if the insulating resin 23b applied to be a thin film is selected, the amount of resin is set only for insulation. This can reduce the amount of resin material applied around the semiconductor chip 2, achieving low cost.

In the semiconductor device where the electrodes in contact with the semiconductor chip are removed in the horizontal direction, if the electrodes on one main surface of the semiconductor chip and the electrodes on the other main surface of the semiconductor chip are removed in the same direction, the insulating element is preferably provided between the projecting portions of the electrodes to be removed in the same direction. For example, as shown in FIGS. 29 and 32, if the projecting portion 5b of the first electrode 5 disposed on the underside of the semiconductor chip 2 and the projecting portion 6b of the second electrode 6 disposed on the top surface of the semiconductor chip 2 are removed in the same direction, an insulating element 24 is preferably provided between the projecting portion 5b of the first electrode 5 and the projecting portion 6b of the second electrode 6 in order to provide insulation between the projecting portion 5b of the first electrode 5 and the projecting portion 6b of the second electrode 6. The insulating element 24 provides insulation between the first electrode 5 and the second electrode 6 that extend in the same direction, outside the peripheral area of the semiconductor chip 2. The material of the insulating element 24 may be an inexpensive insulating inorganic material having higher heat resistance. Specifically, the insulating element 24 may be composed of a mica sheet.

The structure of the semiconductor device 1 described above is a simple heat dissipating structure in which heat generated from the semiconductor chip 2 is directly released to the lower heat dissipating plate 3 through the first electrode 5 disposed on the underside of the semiconductor chip 2. In other words, many components are not disposed between the semiconductor chip 2 and the heat dissipating plate in the structure of the semiconductor device 1. Moreover, an insulating resin having low thermal conduction is not applied (disposed) between the semiconductor chip 2 and the heat dissipating plate. Thus, the structure of the semiconductor device 1 considerably dissipates heat generated from the semiconductor chip 2.

The semiconductor device 1 also has a structure in which heat generated from the semiconductor chip 2 is directly released to the upper heat dissipating plate 4 through the electrode disposed on the top surface of the semiconductor chip 2. Thus, the structure of the semiconductor device 1 has high heat dissipation.

Figure 33:
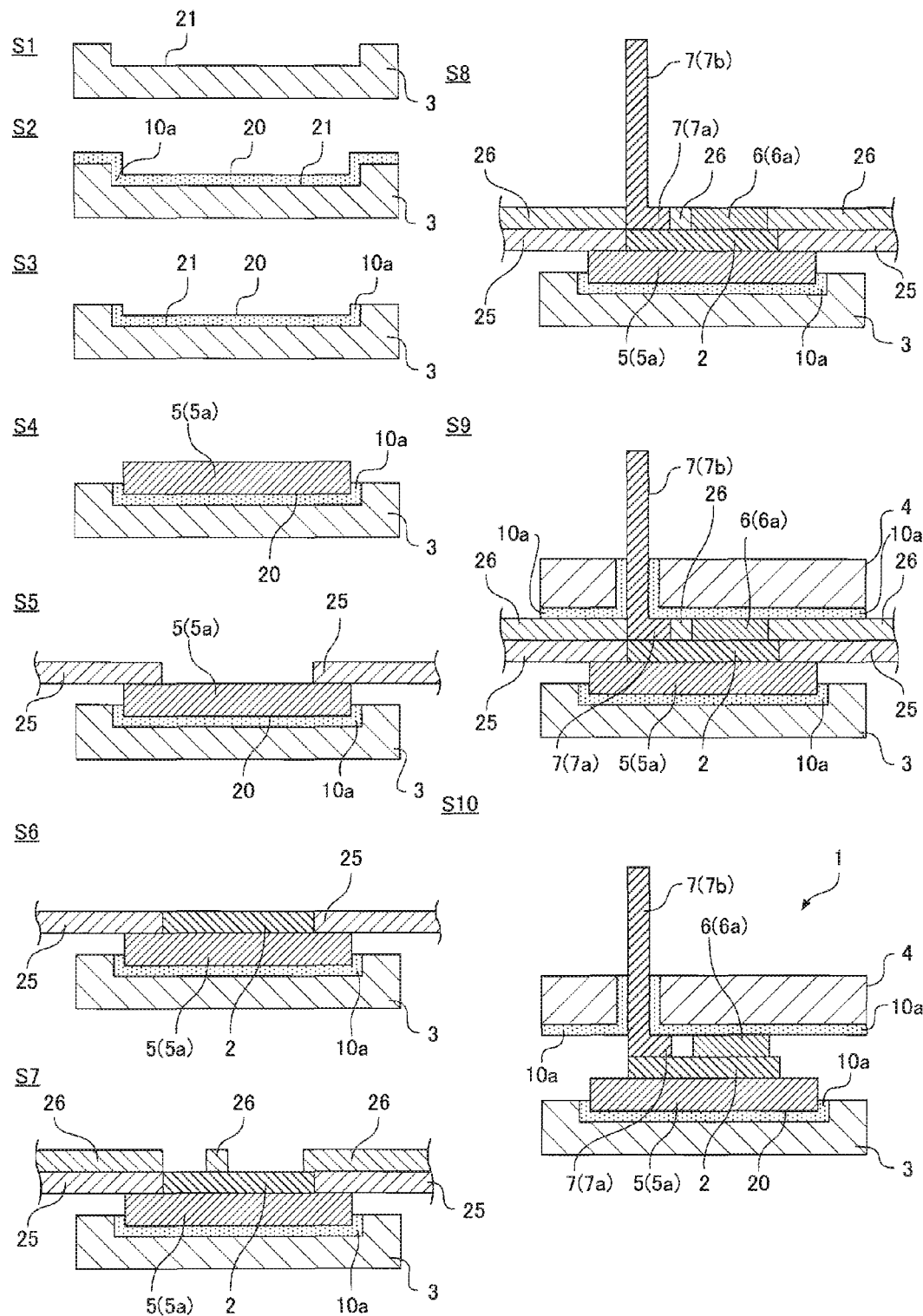
FIG. 33 is a process cross-sectional view schematically showing an example of a method for manufacturing the semiconductor device according to the embodiment of the present invention.

An example of a method for manufacturing the semiconductor device 1 will be described below. FIG. 33 is a process cross-sectional view schematically showing the example of the method for manufacturing the semiconductor device according to the present embodiment.

First, in step S1, the substrate of the lower heat dissipating plate 3 having the second concave portion 21 is prepared. The second concave portion 21 can be formed by, for example, spot facing.

Subsequently, in step S2, the insulating layer 10a made of an inorganic material with a certain thickness is formed on the top surface of the substrate of the lower heat dissipating plate 3 having the second concave portion 21. Thus, the first concave portion 20 is formed on the surface of the insulating layer 10a.

The insulating layer 10a is, for example, an anodic oxide coating formed by anodic oxidation. If the substrate of the lower heat dissipating plate 3 is made of aluminum, an anodic oxide coating of aluminum (alumite) is formed as the insulating layer 10a. Alternatively, the insulating layer 10a may be a diamond thin film formed by sputtering, evaporation, or CVD. Alternatively, the insulating layer 10a may be a ceramic layer formed by ceramic spraying. Preferably, the ceramic material is AlN (aluminum nitride) having high thermal conductivity.

Subsequently, in step S3, an unnecessary part of the insulating layer 10a is removed. Thus, the insulating layer 10a remains only on the inner surface of the second concave portion 21, and the top surface of the substrate of the lower heat dissipating plate 3 is exposed except for the second concave portion 21. The upper end of the insulating layer 10a left on the inner surface of the second concave portion 21 is flush with the top surface of the substrate of the lower heat dissipating plate 3. The unnecessary part of the insulating layer 10a can be removed by, for example, grinding. Alternatively, a part not to be covered with the insulating layer 10a may be masked before the insulating layer 10a is formed. Moreover, the insulating layer may be formed in the second concave portion 21 by disposing the insulating member in the second concave portion 21 of the substrate of the lower heat dissipating plate 3, the insulating member being formed into a predetermined shape by machining, e.g., cutting or grinding. For example, the insulating member may be ceramic.

In step S4, the first electrode 5 is mounted on the lower heat dissipating plate 3 by, for example, a component mounter device. Specifically, the first electrode 5 is disposed on the first concave portion 20 of the insulating layer 10a. Thus, the pressing portion 5a of the first electrode 5 is partially stored in the first concave portion 20 of the insulating layer 10a so as to keep the position of the first electrode 5.

In step S5, a plurality of first tools 25 used for positioning the semiconductor chip 2 to be mounted in the subsequent step (step S6) are disposed at predetermined positions by a holder (not shown) and are held at the positions. Specifically, the first tools 25 are held around the predetermined area or space of the semiconductor chip 2.

In step S6, the semiconductor chip 2 is mounted on the first electrode 5 by, for example, a component mounter device. Specifically, the semiconductor chip 2 is disposed in a space or an area surrounded by the first tools 25. The first tools 25 keep the position of the disposed semiconductor chip 2. FIG. 33 shows that the semiconductor chip 2 is held by the first tools 25 in one direction. The number of the first tools 25 and the positions of the first tools 25 are not particularly limited as long as the first tools 25 keep the position of the semiconductor chip 2 and are removable from the semiconductor device 1 in the subsequent step.

In step S7, a plurality of second tools 26 are disposed at predetermined positions by a holder (not shown) and are held at the positions. The second tools 26 are used for positioning the second electrode 6 and the third electrode 7 that are disposed on the top surface of the semiconductor chip 2 in the subsequent step (step S8). Specifically, the second tools 26 are held around the predetermined area or space of the pressing portion 6a of the second electrode 6 and the pressing portion 7a of the third electrode 7.

In step S8, the second electrode 6 and the third electrode 7 are disposed on the semiconductor chip 2 by, for example, a component mounter device. Specifically, the pressing portion 6a of the second electrode 6 and the pressing portion 7a of the third electrode 7 are disposed in a space or an area surrounded by the second tools 26. The second tools 26 keep the positions of the disposed second electrode 6 and the disposed third electrode 7. FIG. 33 shows that the pressing portion 6a of the second electrode 6 and the pressing portion 7a of the third electrode 7 are held by the second tools 26 in one direction. However, the number of the second tools 26 and the positions of the second tools 26 are not particularly limited as long as the second tools 26 keep the positions of the electrodes disposed on the top surface of the semiconductor chip 2 and are removable from the semiconductor device 1 in the subsequent step.

In step S9, the upper heat dissipating plate 4, which is an example of the pressure contact member, is mounted on the top surfaces of the pressing portions 6a and 7a of the electrodes 6 and 7 by, for example, a component mounter device. At this point, the projecting portions of the electrodes 5 to 7 extending in a vertical direction are inserted into respective holes in advance formed on the upper heat dissipating plate 4. FIG. 33 illustrates only the projecting portion 7b of the third electrode 7. The top surfaces of the pressing portions 6a and 7a of the electrodes 6 and 7 are in contact with the insulating layer 10a formed on the upper heat dissipating plate 4.

After that, the lower heat dissipating plate 3 and the upper heat dissipating plate 4 are pressed to the semiconductor chip 2 by the pressure generating mechanism (not shown) and are kept at a pressure. The pressure presses and joins the pressing portion 5a of the first electrode 5 to the lower heat dissipating plate 3 and the semiconductor chip 2 and presses and joins the pressing portion 6a of the second electrode 6 and the pressing portion 7a of the third electrode 7 to the semiconductor chip 2 and the upper heat dissipating plate 4. At this point, the pressure generating mechanism applies a pressure of at least 0.5 MPa and less than 30 MPa to the pressing portion 6a of the second electrode 6 disposed on the top surface of the semiconductor chip 2. The pressure generating mechanism may be a combination of a screw and a spring or a clip.

In step S10, the first tools 25 and the second tools 26 are horizontally removed with respect to the semiconductor chip 2 by the holder (not shown). The second tools 26 that keep the positions of the electrodes disposed on the top surface (second main surface) of the semiconductor chip 2 may be vertically removed with respect to the semiconductor chip 2. In this case, an opening allowing the passage of the second tool 26 needs to be formed on the upper heat dissipating plate 4. The first tools 25 that keep the position of the semiconductor chip 2 may be vertically removed like the second tools 24.

Figure 34:
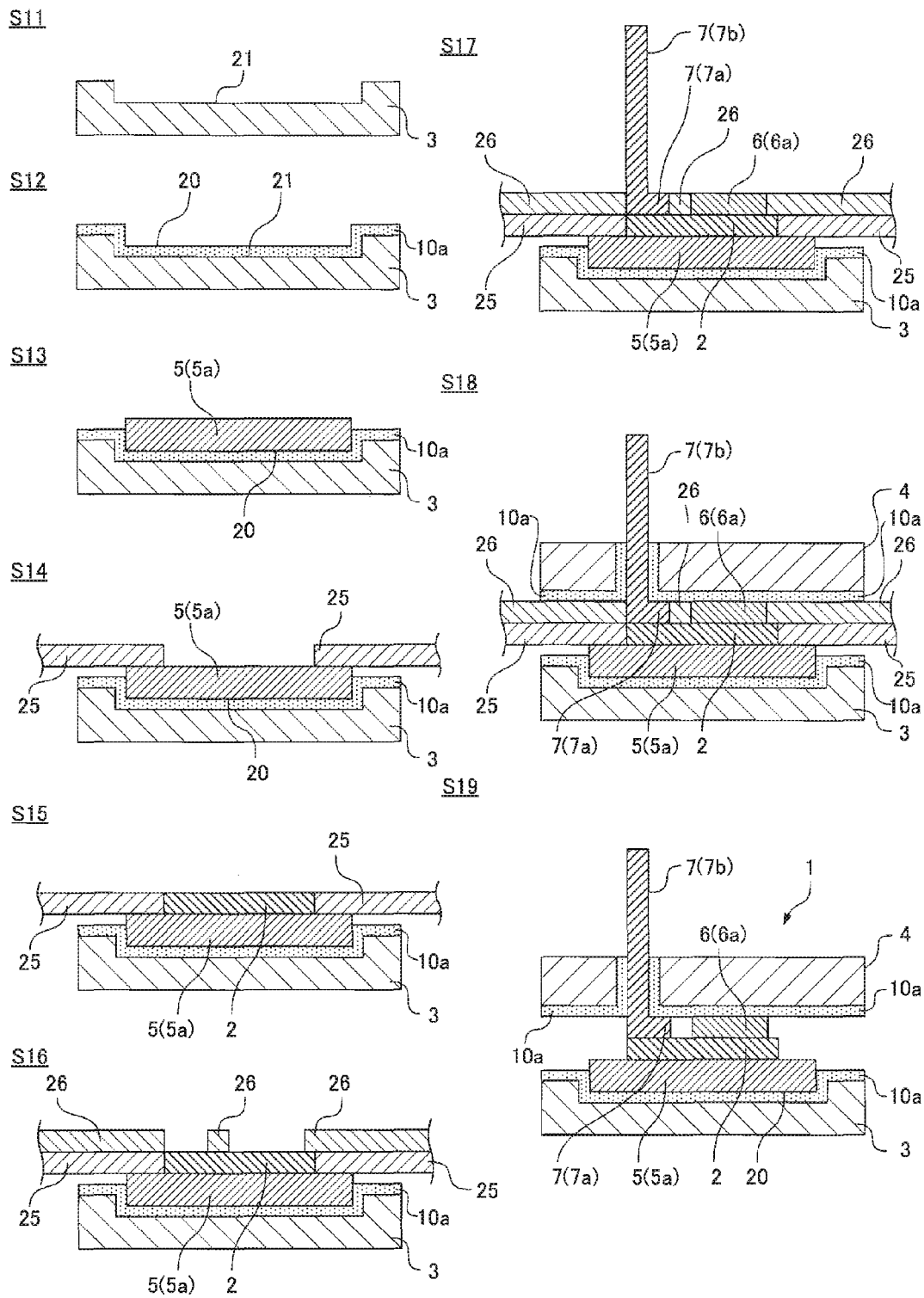
FIG. 34 is a process cross-sectional view schematically showing another example of the method for manufacturing the semiconductor device according to the embodiment of the present invention.
Figure 35:
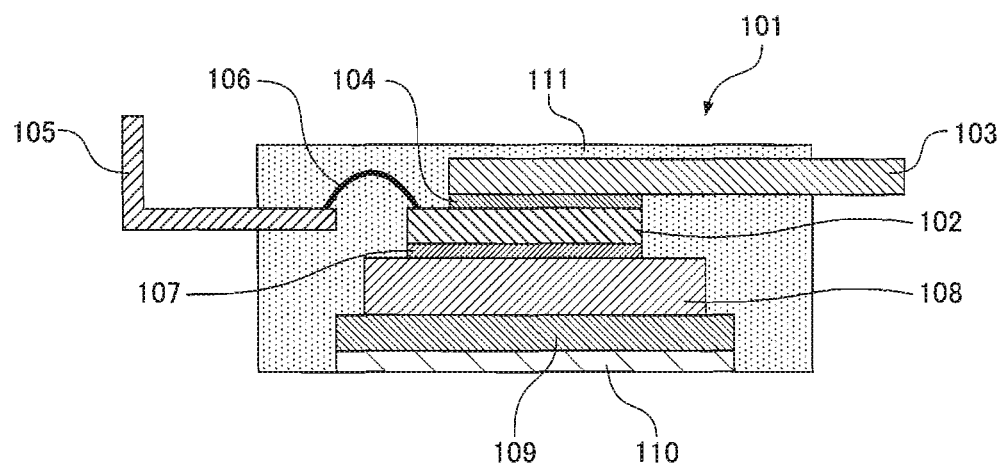
FIG. 35 is a cross-sectional view schematically showing the structure of a known power module.
Figure 36:
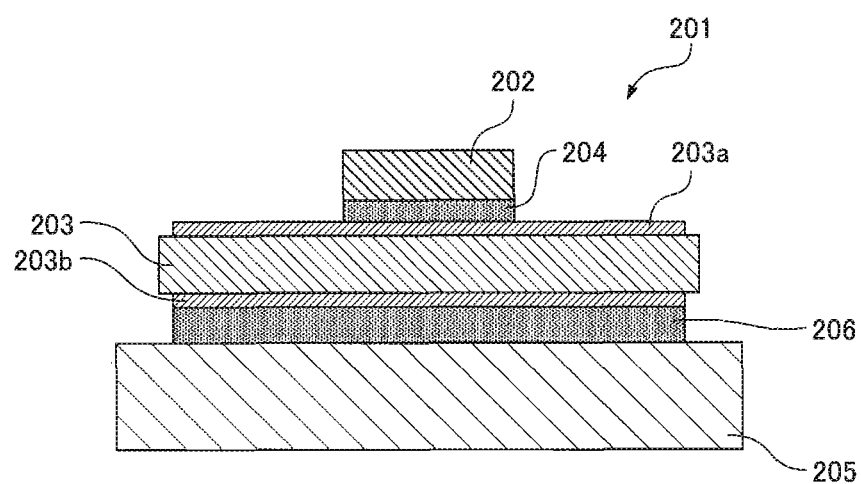
FIG. 36 is a cross-sectional view schematically showing the structure of another known power module.

FIG. 34 is a process cross-sectional view schematically showing another example of the method for manufacturing the semiconductor device according to the present embodiment. The manufacturing process in FIG. 34 is different from that of FIG. 33 only in the deletion of step S3 of the manufacturing process in FIG. 33, that is, the step of removing an unnecessary part of the insulating layer 10a.

Even if the semiconductor device 1 has a different structure from the structure manufactured by the manufacturing processes in FIGS. 34 and 33, the semiconductor device 1 can be manufactured by the same manufacturing process as those of FIGS. 34 and 33.

As has been discussed, the present embodiment can achieve the semiconductor device with reliable electric connection and high heat dissipation.

Industrial Applicability

According to a semiconductor device and a method for manufacturing the same of the present invention, the semiconductor device can reliably connect a semiconductor chip and electrodes disposed on the semiconductor chip. The present invention is useful for a power module (high-power semiconductor device) having a semiconductor chip with large fluctuations in temperature.

The invention claimed is:

1. A semiconductor device comprising:
a semiconductor chip having a first main surface and a second main surface opposite to the first main surface;
a heat dissipating plate opposed to the first main surface;
a first surface electrode formed on the first main surface:,
a first electrode disposed between the first main surface and the heat dissipating plate so as to be electrically connected to the first surface electrode of the semiconductor chip;
a pressure contact member opposed to the second main surface;
a second electrode disposed between the second main surface and the pressure contact member so as to be electrically connected to the semiconductor chip; and
a pressure generating mechanism that generates a pressure for pressing the first electrode into contact with the heat dissipating plate and the semiconductor chip and pressing the second electrode into contact with the pressure contact member and the semiconductor chip,
wherein the first electrode has a portion in contact with the first surface electrode and the first surface electrode has a portion in contact with the first electrode such that the portion of the first electrode has a higher surface roughness than the portion of the first surface electrode, and the first electrode has a lower hardness than the first surface electrode.

2. The semiconductor device according to claim 1, further comprising an insulating element for providing insulation between the heat dissipating plate and the first electrode, the heat dissipating plate being made of one of copper and aluminum.

3. The semiconductor device according to claim 1, wherein the first electrode has a surface opposed to the first main surface of the semiconductor chip such that the surface of the first electrode opposed to the first main surface has a larger area than the first main surface, and
the semiconductor chip is disposed such that the surface of the first electrode opposed to the first main surface is placed out of an outer periphery of the first main surface projected to the surface of the first electrode opposed to the first main surface.

4. The semiconductor device according to claim 1, wherein the heat dissipating plate has a first concave portion that is opened near the first main surface of the semiconductor chip, and
at least a part of the first electrode disposed between the first main surface and the heat dissipating plate is placed in the first concave portion.

5. The semiconductor device according to claim 1, wherein the first electrode has a second concave portion that is opened near the first main surface of the semiconductor chip, and
a part of the semiconductor chip is placed in the second concave portion.

6. The semiconductor device according to claim 1, wherein the pressure contact member is a second heat dissipating plate.

7. The semiconductor device according to claim 6, further comprising an insulating element for providing insulation between the second heat dissipating plate and the second electrode,
the second heat dissipating plate being made of one of copper and aluminum.

8. The semiconductor device according to claim 1, wherein the heat dissipating plate is made of one of diamond and ceramic.

9. The semiconductor device according to claim 8, wherein the heat dissipating plate is made of one of aluminum nitride, silicon nitride, and alumina.

10. The semiconductor device according to claim 6, wherein the second heat dissipating plate is made of one of diamond and ceramic.

11. The semiconductor device according to claim 10, wherein the second heat dissipating plate is made of one of aluminum nitride, silicon nitride, and alumina.

12. The semiconductor device according to claim 1, further comprising a third electrode that is disposed at a different place from the second electrode between the pressure contact member and the semiconductor chip, is electrically connected to the semiconductor chip, and is pressed into contact with the pressure contact member and the semiconductor chip by the pressure generating mechanism,
the pressure generating mechanism generating a pressure such that a pressure applied to the second electrode is larger than a pressure applied to the third electrode.

13. The semiconductor device according to claim 1, wherein the semiconductor chip has one of an emitter electrode, a source electrode, and an anode electrode as a second surface electrode formed on the second main surface,
the second electrode is electrically connected to one of the emitter electrode, the source electrode, and the anode electrode, and
a pressure applied to the second electrode by the pressure generating mechanism is at least 0.5 MPa and less than 30 MPa.

* * * * *